United States Patent [19]
Dolby

[11] 3,972,010

[45] *July 27, 1976

[54] COMPRESSORS, EXPANDERS AND NOISE REDUCTION SYSTEMS

[76] Inventor: Ray Milton Dolby, 731 Sansome St., San Francisco, Calif. 94111

[ * ] Notice: The portion of the term of this patent subsequent to Sept. 2, 1992, has been disclaimed.

[22] Filed: Dec. 20, 1974

[21] Appl. No.: 537,574

Related U.S. Application Data

[60] Division of Ser. No. 395,562, Sept. 10, 1973, Pat. No. 3,903,485, which is a continuation of Ser. No. 227,144, Feb. 17, 1972, abandoned, which is a continuation of Ser. No. 789,703, Jan. 8, 1969, abandoned, which is a continuation-in-part of Ser. No. 569,615, Aug. 2, 1966, abandoned.

[30] Foreign Application Priority Data

Jan. 10, 1968 United Kingdom.................. 1540/68

[52] U.S. Cl. ................................................. 333/14
[51] Int. Cl.² ........................................... H04B 1/64
[58] Field of Search ....................................... 333/14

[56] References Cited

UNITED STATES PATENTS

3,729,693    4/1973    Dolby ................................... 333/14

*Primary Examiner*—Paul L. Gensler
*Attorney, Agent, or Firm*—Robert F. O'Connell

[57] ABSTRACT

A signal processing system for providing compressor and expander operation which system includes a main, or straight through, signal path and a further signal path in parallel therewith. The further path derives its input from the input to the main path or from some later point in the signal path. The output of the further signal path is combined additively with that of the main path for compressor operation and subtractively for expander operation, such further signal path output being appropriately limited so that it can only make a noticeable contribution to the resultant signal level at low input signal levels. True complementarity is attainable by the use of a compressor and expander together to provide an overall noise reduction action without introducing defects into the signal being processed.

2 Claims, 39 Drawing Figures

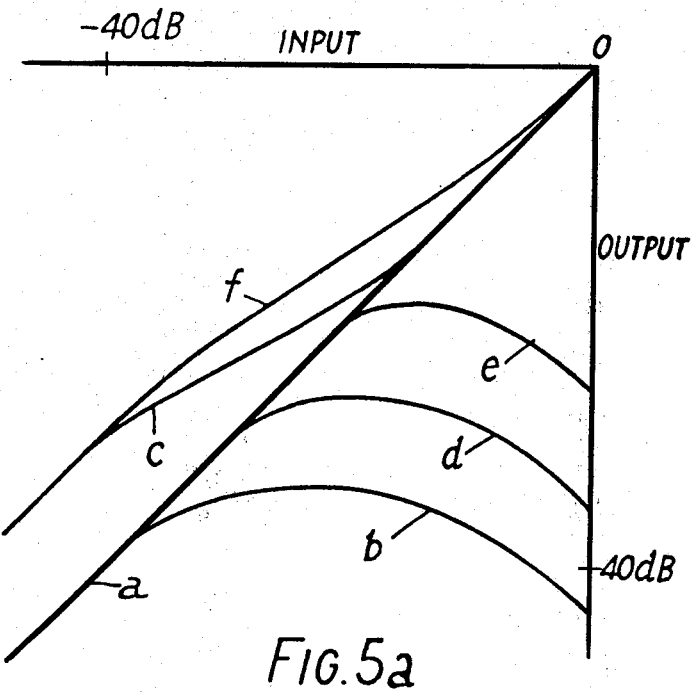

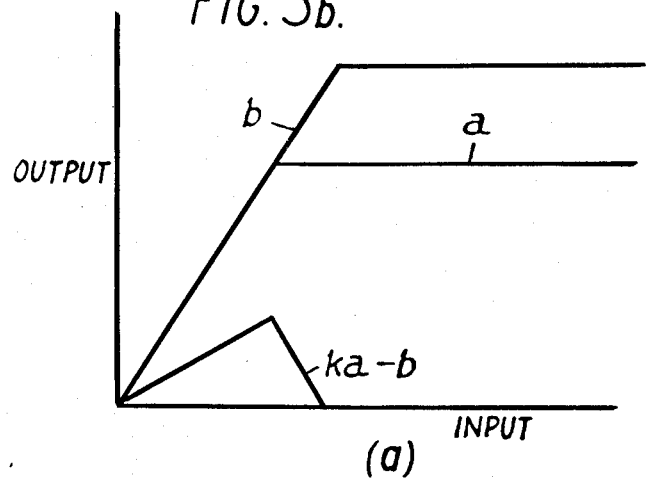
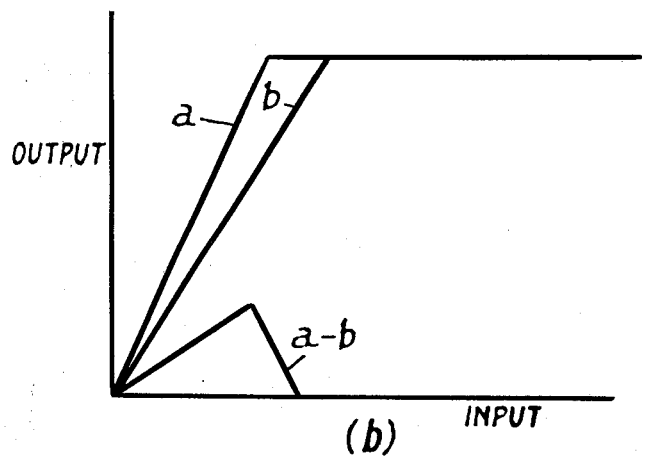

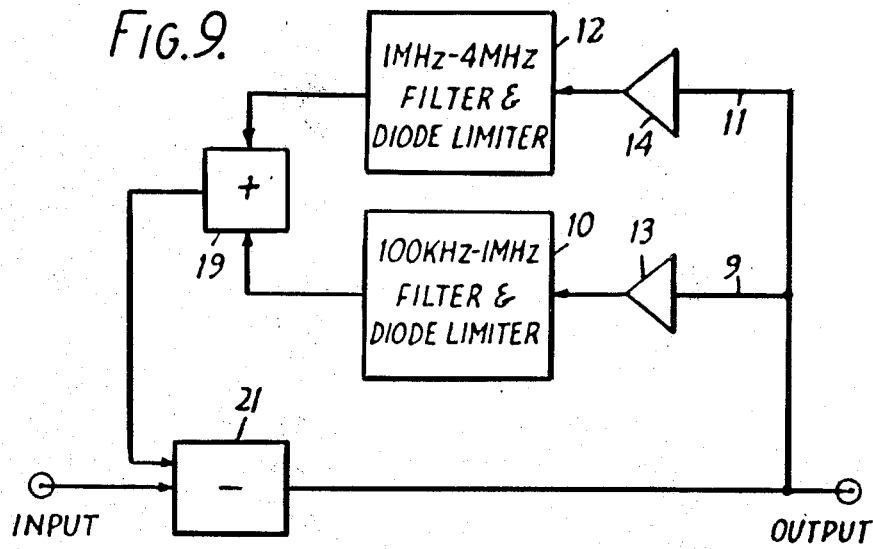
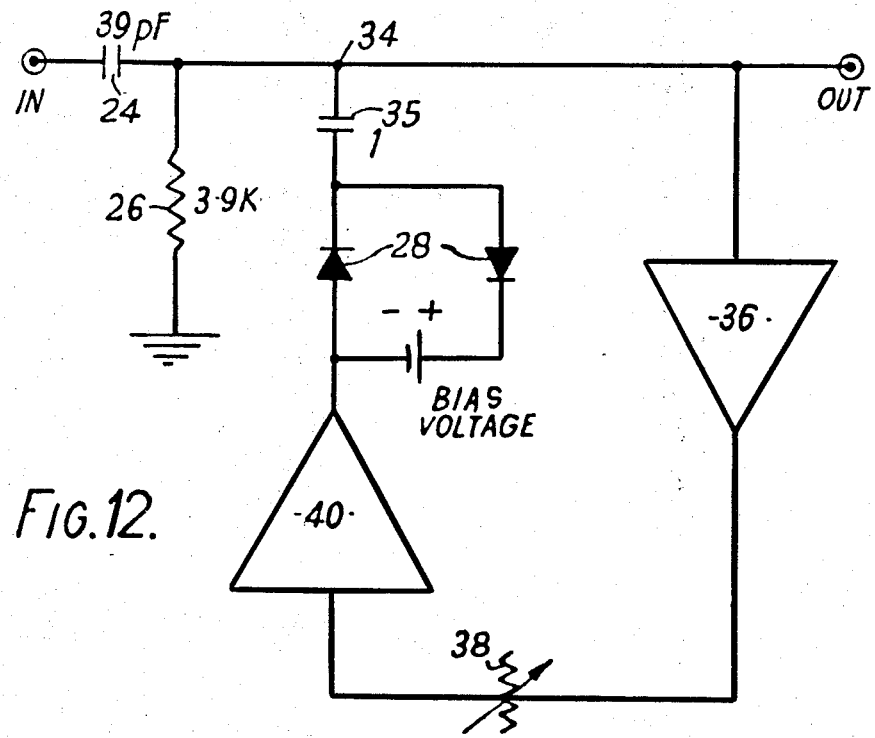

COMPRESSORS, EXPANDERS AND NOISE REDUCTION SYSTEMS

This application is a division of my application Ser. No. 395,562, Sept. 10, 1973, now U.S. Pat. No. 3,903,485, issued on Sept. 2, 1975, which is a continuation of my application Ser. No. 227,144, Feb. 17, 1972, now abandoned, which is in turn a continuation of Ser. No. 789,703, Jan. 8, 1969, now abandoned, which is in turn a continuation-in-part of Ser. No. 569,615, Aug. 2, 1966, now abandoned.

INTRODUCTION AND PRIOR ART

This invention relates to compressors and expanders and noise reduction systems (compandors) of the type in which a signal is subjected to amplitude compression before being fed through transmission or recording and playback apparatus which introduces noise and thereafter to complementary expansion. For convenience the apparatus which introduces the noise will be called the "information channel". In audio systems the noise is usually hiss and hum but it may also take the form of rumble, clicks, crosstalk and so on. The main noise problem in video system is high frequency noise, which leads to a grainy picture.

The compressors and expanders according to this invention are suitable for use with audio, video and other electrical signals. An important use, but not the sole use, of compressors and expanders is to effect noise reduction, a complete noise reduction system comprising a compressor preceding the apparatus which introduces the noise and a complementary expander following the said apparatus.

Many noise reduction systems are known, including the use of pre-emphasis at the lower and upper parts of the audio range. This simple approach is of limited use because overloading must be avoided when the audio signal includes a substantial amount of energy in the high or low frequency ranges. Recording is sometimes effected on two channels, one recorded at a level up to 30dB above the other. On playback the high level channel is automatically selected for low level passages and vice versa, but this technique is of limited applicability and necessarily uses two channels instead of one. Other systems use non-linear circuits, but these introduce intermodulation distortion in audio systems. It is also known to control a low-pass filter automatically in response to signal level to filter out hiss during low-level passages only. In using compressors and expanders it is known to vary the degree of expansion on playback automatically in response to the signal level.

In a conventional compressor or expander the operating law is determined by a variable gain device, together with its control circuits, through which the full signal passes. The signal is thus subject to any distortions arising in the variable gain system.

General Principles

The present invention is contrasted from such prior art in that the signal is split into two components 1) An unaltered component which contributes mainly the high level signals and 2) a low-level differential component from a limiter circuit. The overall compression characteristic is derived by combining the two components.

This differential technique has several advantages. Distortion is remarkably reduced, since the limiter contribution is negligible at high levels. Tracking accuracy problems between compression and expansion are practically eliminated, since the compression or expansion law is largely determined by the limiting threshold and the addition proportions of the two components, factors which are readily controlled. Thus a favourable property of the method is a relative insensitivity to errors in level between compression and expansion. The method is also advantageous under dynamic and transient signal conditions. For example, it is possible to hold overshoots to negligible values, thereby avoiding overloading of the information channel.

The effect of this arrangement is that, at high signal levels, the output of the compressor or expander is substantially unchanged from the input signal, but at low levels the amplifier in the further path effects compression. The limiting means can be linear, which makes the compressor or expander suitable for use in audio applications.

The abovementioned unaltered component is provided by a main or straight-through signal path. The low-level differential component is provided by a further path whose output combines additively with that of the main path in the case of a compressor and subtractively in the case of an expander. The further path includes a limiter, which results in the contribution of the further path being negligible in comparison with that of the main path, except at low signal levels.

It will be convenient to classify the compressors and expanders according to the invention into two types, Type I and Type II.

In Type I devices the input to the further path is the same as the input to the main path in the case of a compressor and consists of the output of the combining means in the case of an expander.

If then the input signal to the compressor is $x$, the signal in the information channel is $y$, and the output signal of the expander is $z$, we have $$y = (1 + F_1)x$$

and $$z = y - F_2 z \text{ or } z = y/(1 + F_2)$$

where $F_1$ and $F_2$ represent the transfer characteristics of the further paths in the compressor and expander respectively. Therefore, we have $$z = \frac{1 + F_1}{1 + F_2} x$$

and if $F_1 = F_2$;

$z = x$, as required. Note that this result is obtained without the need for high amplification, as would be the case if the complete compressor were enclosed within a feedback loop. Although $z = x$, noise introduced by the information channel is acted upon by the expander only, to effect substantial attenuation thereof at low signal levels, e.g. 10 dB noise reduction. The form of $F_1$ is that of a substantial multiplier at low signal levels, decreasing at higher levels, so that the output of the further path is substantially constant at higher levels. The characteristic of $F_1$ can even make the output of the further path a decreasing function of $x$ at higher levels, as later described.

In Type II devices the inputs to the further paths are connected differently. In the expander, the further path receives the same input as the main straight-through signal path, whereby the expansion law becomes $z = (1 = F_2)y$. In the compressor, the further path takes its input from the compressor output, whereby the compression law is $y = x + F_1y$, or $y = x/(1 = F_1)$. Again, if $F_1 = F_2$, it is readily seen that $z = x$.

In a complete noise reduction system the expander will preferably be of the same type as the compressor, though this is not essential in all situations. If a Type I compressor is used with a Type II expander it can be shown that $$z = x(1 + F_1 - F_2 - F_1F_2)$$

If $F_1 = F_2 = F$ then $$z = x(1 - F^2)$$

Similarly, if a Type II compressor is used with a Type I expander $$z = x/(1 = F_1 + F_2 - F_1F_2)$$
$$= x/(1 - F^2) \text{ when } F_1 = F_2 = F.$$

It is clear that the errors thus produced will be small provided the maximum value of F is small, i.e. provided low limiting thresholds are used. What is more, the errors can be minimised by appropriate choice of the functions $F_1$ and $F_2$.

A compressor or expander can also be constructed by including an expander or compressor, respectively, of either the first or the second type in the feedback loop of a high-gain feedback amplifier.

The main significance of Type II devices as compared with Type I devices is that: a) in the compressor, in which a positive feedback loop with a gain less than unity is used, the circuit has inherently high Nyquist stability; b) in the expander, a closed loop is not used, stability problems again being avoided. It is thus possible to design simple and inexpensive noise reduction systems, especially with regard to video signals, in which stability aspects are of notable importance because of the wide bandwidths handled. An example of a simplified Type II video expander, such as might be incorporated in a domestic television receiver, is described in the following specification.

It should be pointed out that the location of amplifier stages in devices according to the invention is a matter of detailed design rather than fundamental importance. For this reason little attention is paid hereinafter to this aspect. In Type II devices amplifiers are theoretically unncessary but will often be required in practice for impedance matching and so on. In Type I devices a limited degree of compression or expansion is theoretically attainable without amplification; in practice amplification will almost always be necessary in the further path though even this can theoretically be replaced by attenuation in the main path, (such amplification as is necessary being effected in a stage preceding or following the device according to the invention).

It should also be pointed out that the main and further paths provided in accordance with the invention are quite distinct from the parallel paths provided in some known compressors or expanders for the purpose of operating separately upon different parts of the signal band. Nevertheless, it is often useful to combine such known frequency selective techniques with the present invention.

Thus it is possible for the further path to treat the whole of the signal band, but in most practical applications the further path will be restricted to pass signals in a particular band only, forming part only of the overall signal band. Furthermore, two or more further paths can be provided to deal selectively with different frequency bands.

If the further path has bandpass characteristics (which includes high-pass or low-pass characteristics at the top and bottom of the overall frequency range respectively), noise reduction can be effected selectively in a particular part of the frequency spectrum, subject say to hiss or hum or, in a video system, to high frequency noise. Furthermore, in most applications it is desirable to use a plurality of further paths to deal selectively with different bands, so that high amplitude signals in one band do not prevent noise reduction in another band in which there may be low level signals.

An expander may sometimes be used to improve the quality of a signal which was not previously subjected to the action of the compressor, and there may also be occasions when the compressor is used without the expander to provide certain equalisation characteristics. In general, however, a complete noise reduction system will include both the compressor, feeding the information channel, and the expander, fed by the information channel.

In a modification of the compressor according to the invention, two information channels are used, one for the straight-through signal from the compressor and one for the output of the further path thereof or the combined outputs of the several further paths. These outputs are then combined at the expander to provide the input to the expander. This approach is of use when it is desired in a compatible system to have the normal signal separately available.

In an audio system linear limiters are used, which are controlled by smoothed control signals to prevent the introduction of distortion. Each linear limiter may then, however, be followed by a non-linear limiter which is effective during the finite time taken by the smoothed control signal to build up, thereby preventing overloading of the information channel in this interval. In this arrangement the non-linear limiter acts without introducing audible distortion because of the shortness of the interval and because of the low amplitude of the limiter output as compared with that of the main channel. Alternatively, the linear limiting action may be effected by the use of a variable cut-off frequency filter, the cut-off frequency of which is automatically shifted to narrow the passband when the filter output rises above a certain level.

In a system in which phase is preserved, e.g. a video system, the output of the further path may be limited by a simple diode circuit which automatically shifts the filter cutoff frequency to narrow the pass band when the filter output rises above a certain level.

In the case of a color television signal, a significant reduction of moire patterns, as well as of wide-band noise, may be achieved if the further paths take account of the color sub-carrier and preferably also its sidebands.

In certain situations a signal may be unavailable for compression or expansion except in carrier frequency form. By the use of appropriate carrier rejection filters and linear or non-linear limiters, it is possible to compress or expand the sidebands and thereby the signal information.

In the simplest form of the invention, the further path may incorporate only a single limiting channel. It is sometimes useful to employ a number of parallel connected limiters in a single further path, each limiter having a different limiting threshold, and/or a different applied signal level. By combining the outputs of the limiters either all additively or some subtractively before combination with the signal in the main or straight-through path, it is possible to build up the overall compression and expansion transfer characteristics having various desired shapes. This can be done with high accuracy and repeatability. Moreover, if the linear limiters are followed by non-linear limiters having appropriate thresholds, as described in more detail below, negligible overshoot is obtained.

One particular aspect of curve shaping relates to obtaining an output from the further path which, after initially increasing, becomes a decreasing function of the input signal level; this property may be referred to as a down-turning characteristic. Down-turning characteristics are of significance because they result in the output of the further path becoming negligible at high signal levels, so that under such conditions the output from the compressor or expander is substantially the main, unaltered signal only. Down-turning characteristics are applicable to video systems as well as audio systems.

In the following specification an adaptation of the multiple limiter curve shaping technique is described for obtaining a down-turning characteristic for video signals. A further method, in which the incoming signal is used to derive a clamping signal for use in the limiter, is also described.

DRAWINGS

Further description of the various embodiments constituting the present invention will now be given, by way of example, with reference to the accompanying drawings, in which:

FIG. 4 and 5(a) show transfer characteristic curves,

FIGS. 5(b) and 5(c) are curves illustrating the production of down-turning characteristics by two different subtraction methods.

Figure 6:
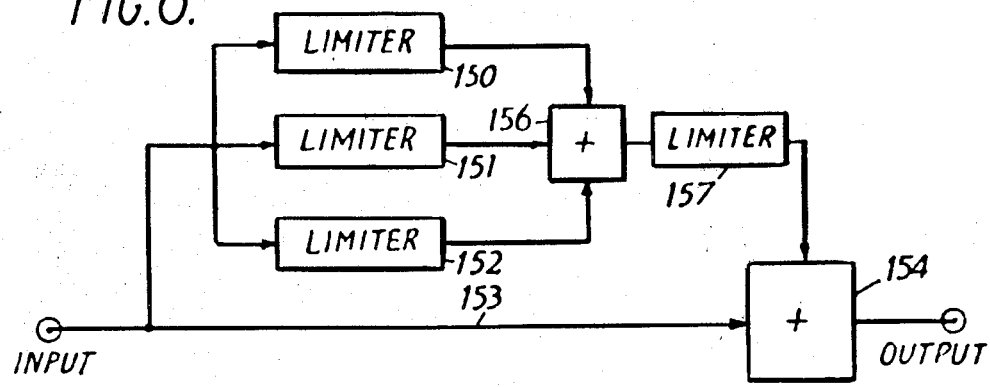
Figure 7:
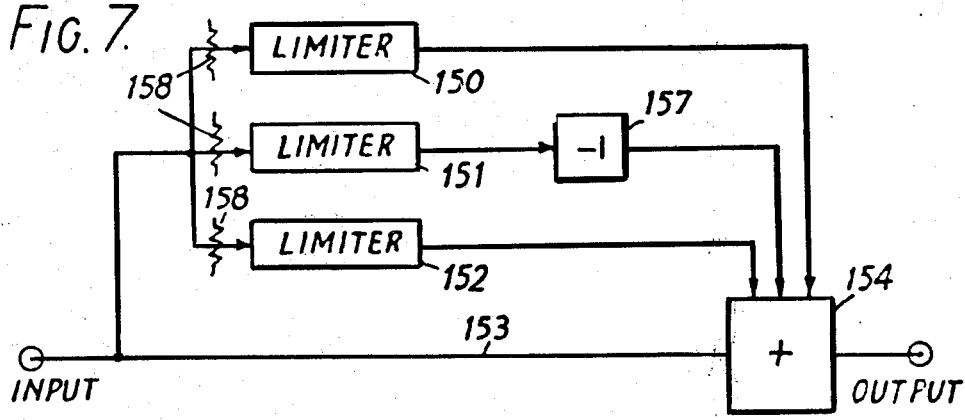

FIGS. 6 and 7 illustrate Type I compressor circuits with a plurality of limiters in parallel for shaping characteristics.

Figure 6A:
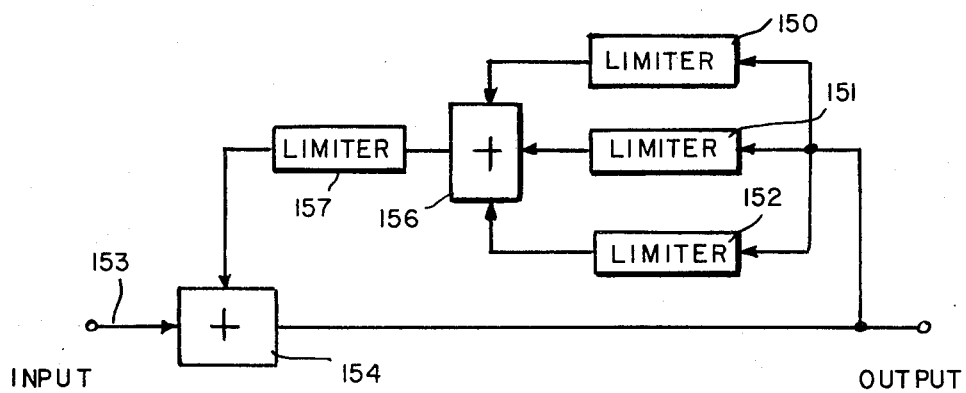
Figure 7A:
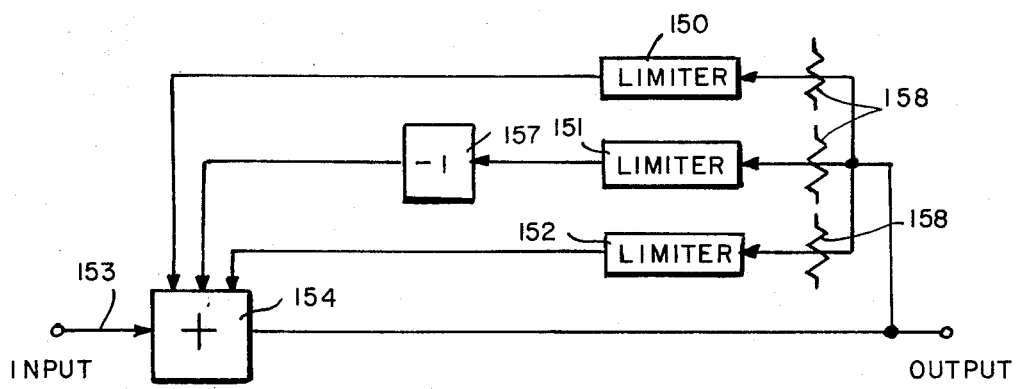

FIGS. 6A and 7A show the equivalent Type II circuits.

Figure 8:
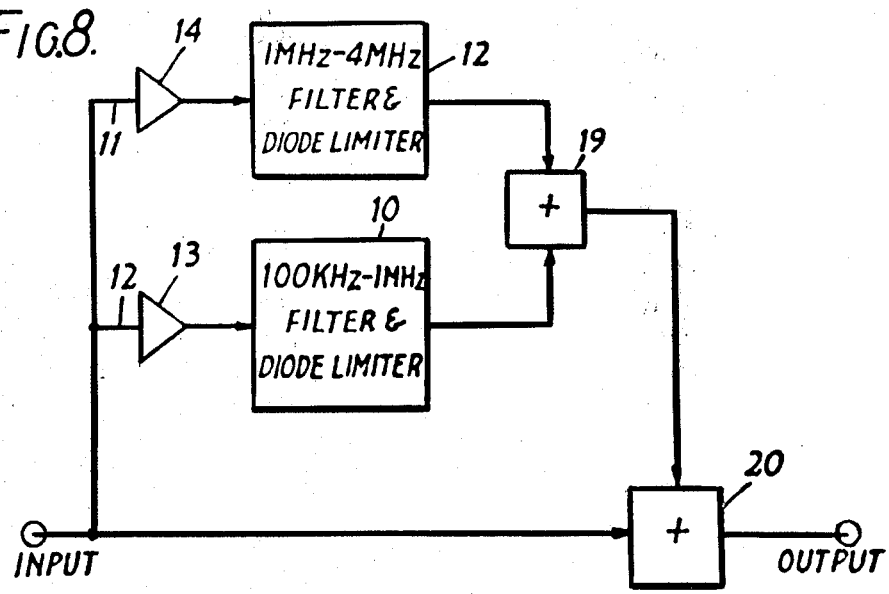

FIGS. 8 and 9 respectively illustrate a video compressor and expander (Type I).

Figure 8A:
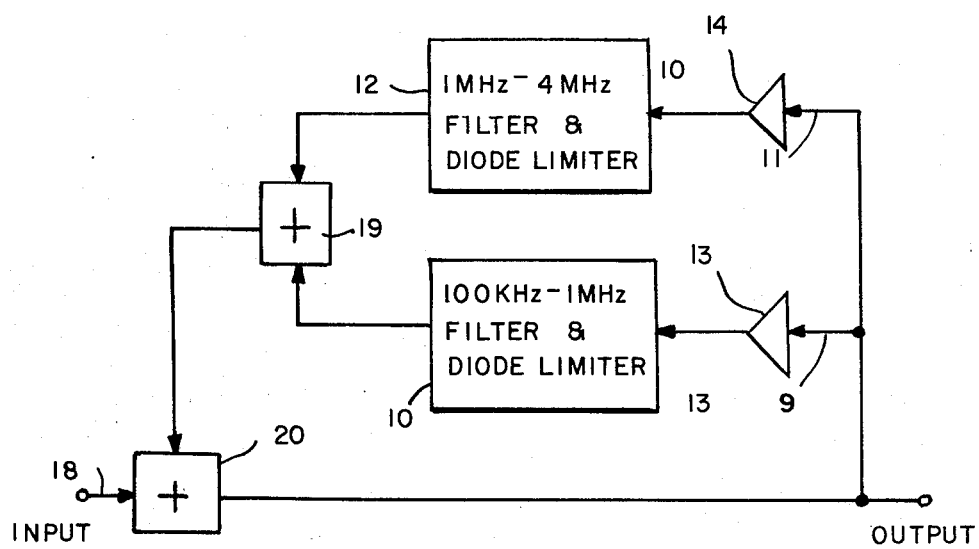
Figure 9A:
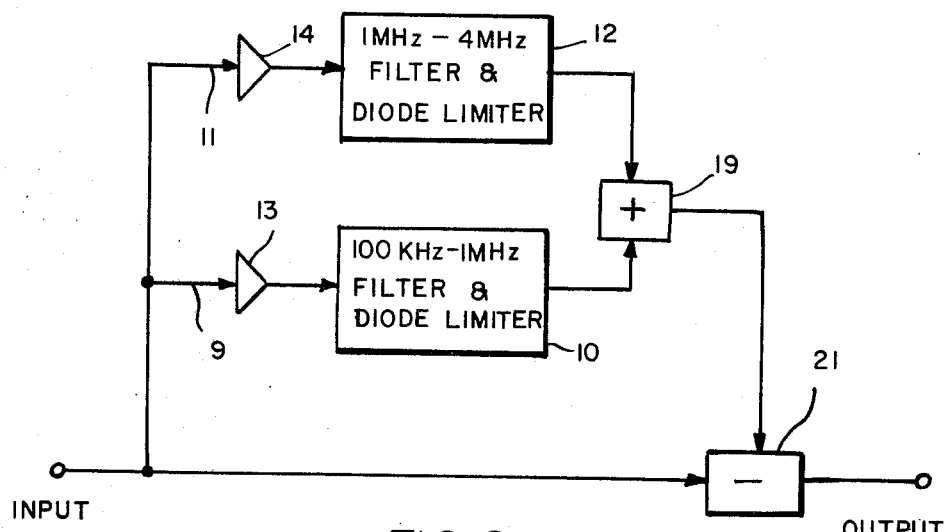

FIGS. 8A and 9A show the equivalent Type II compressor and expander, respectively.

Figure 10:
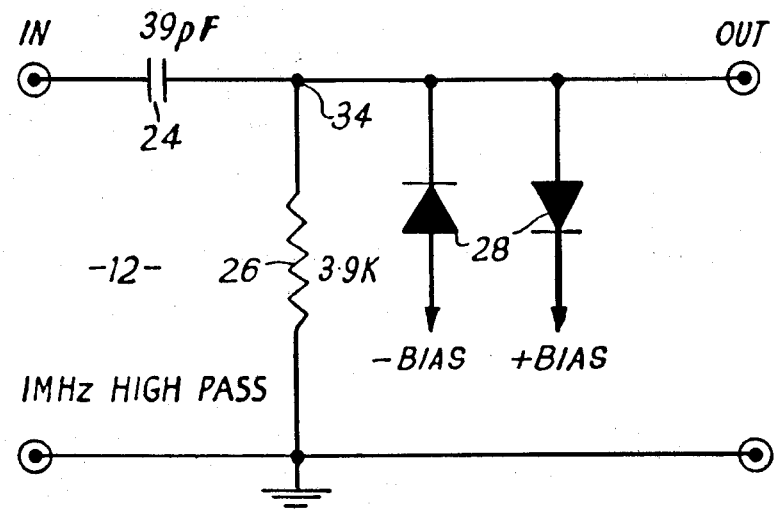
Figure 11:
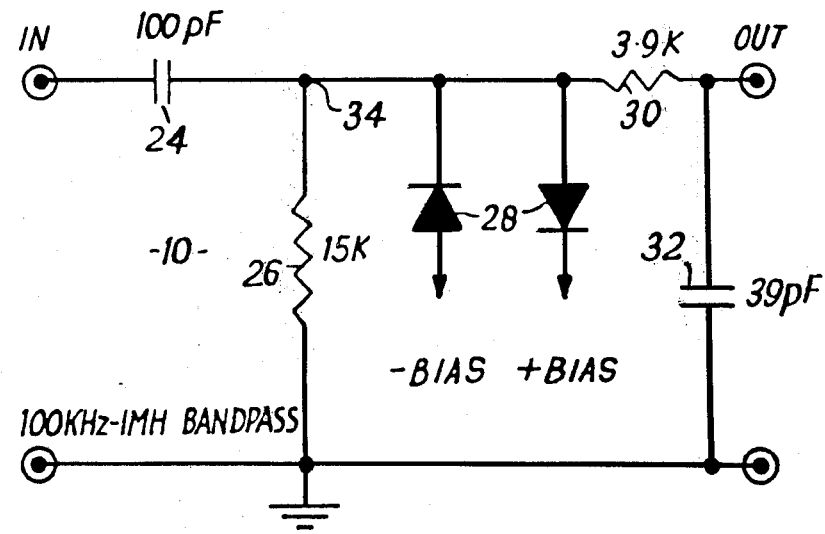

FIGS. 10 and 11 show two filter-limiters for the devices of FIGS. 8, 9, 8A and 9A.

Figure 13:
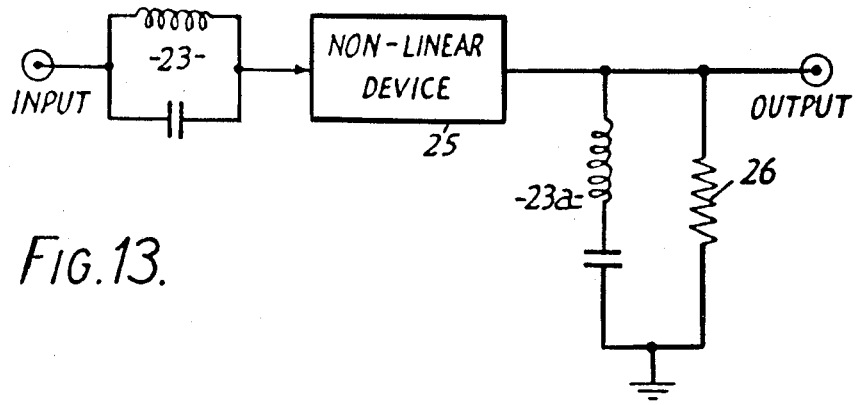
Figure 14:
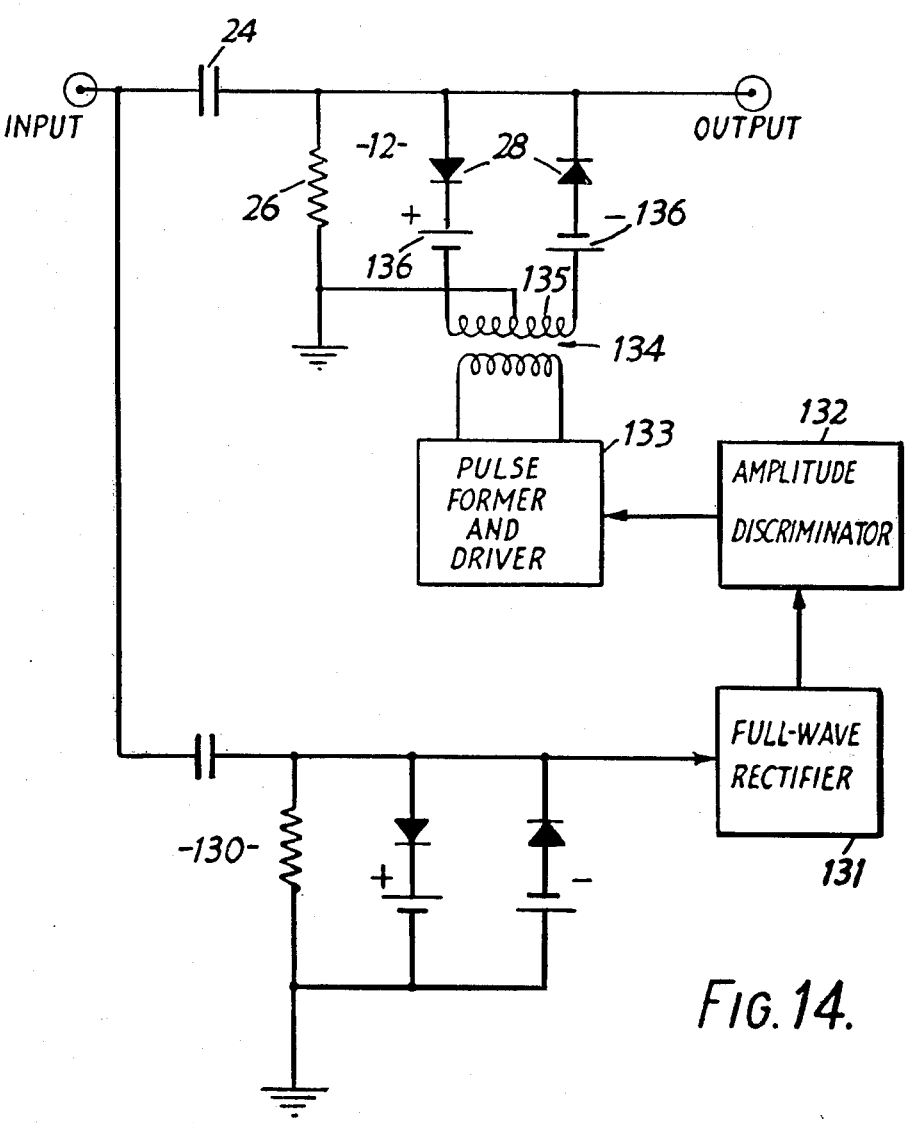

FIGS. 12 to 14 show various modified filter-limiters.

Figure 15:
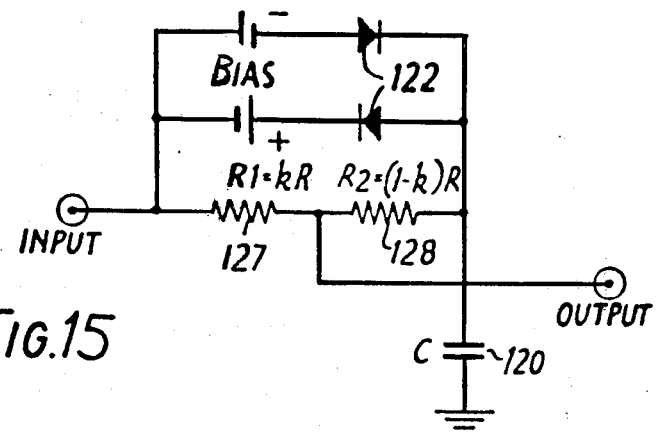

FIG. 15 shows a simplified Type II video expander.

Figure 15A:
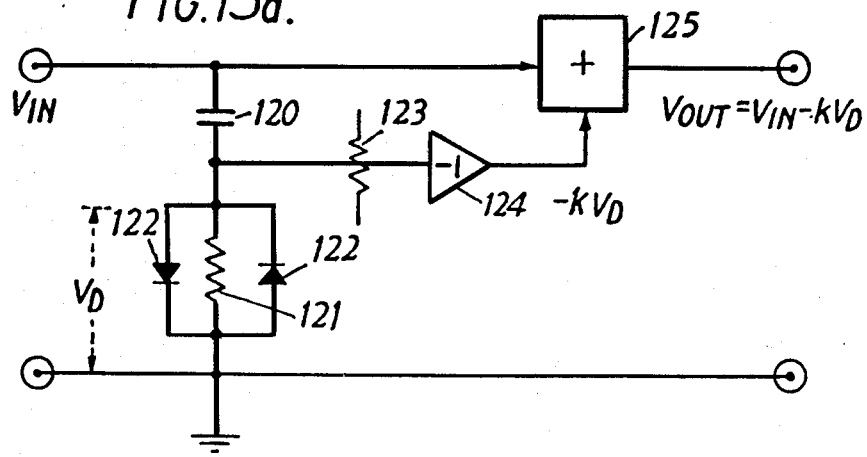

FIGS. 15(a), (b) and (c) show related circuit diagrams explaining the development of FIG. 15.

Figure 16:
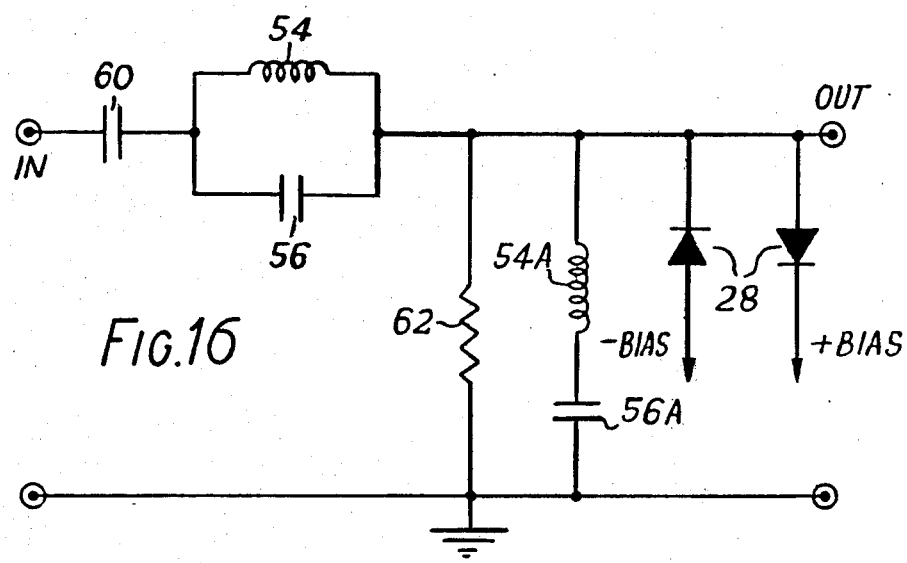

FIG. 16 shows a filter-limiter for use with a colour television signal.

Figure 17:
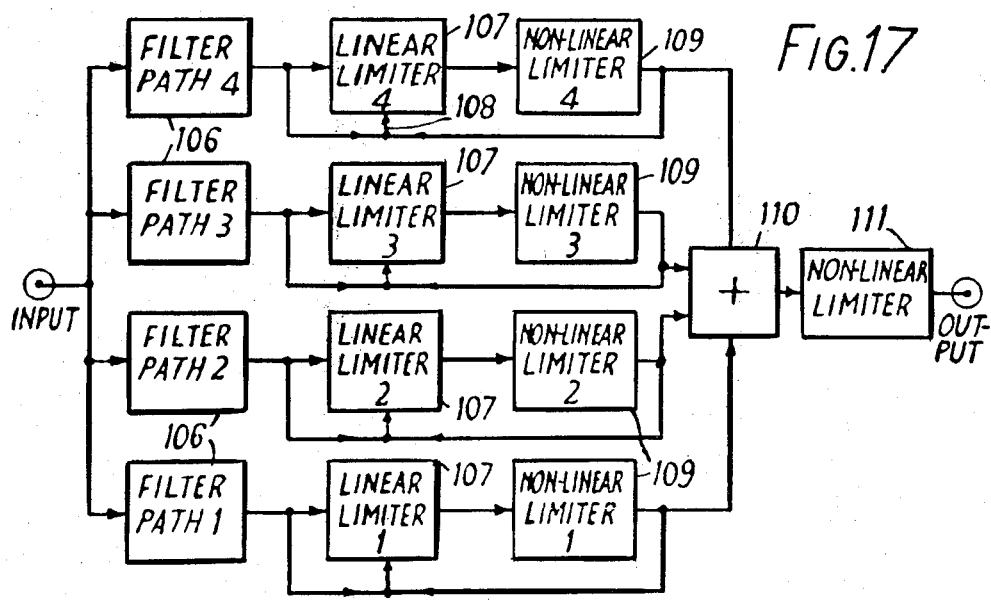

FIG. 17 is a block diagram for the further paths of an audio system.

Figure 18:
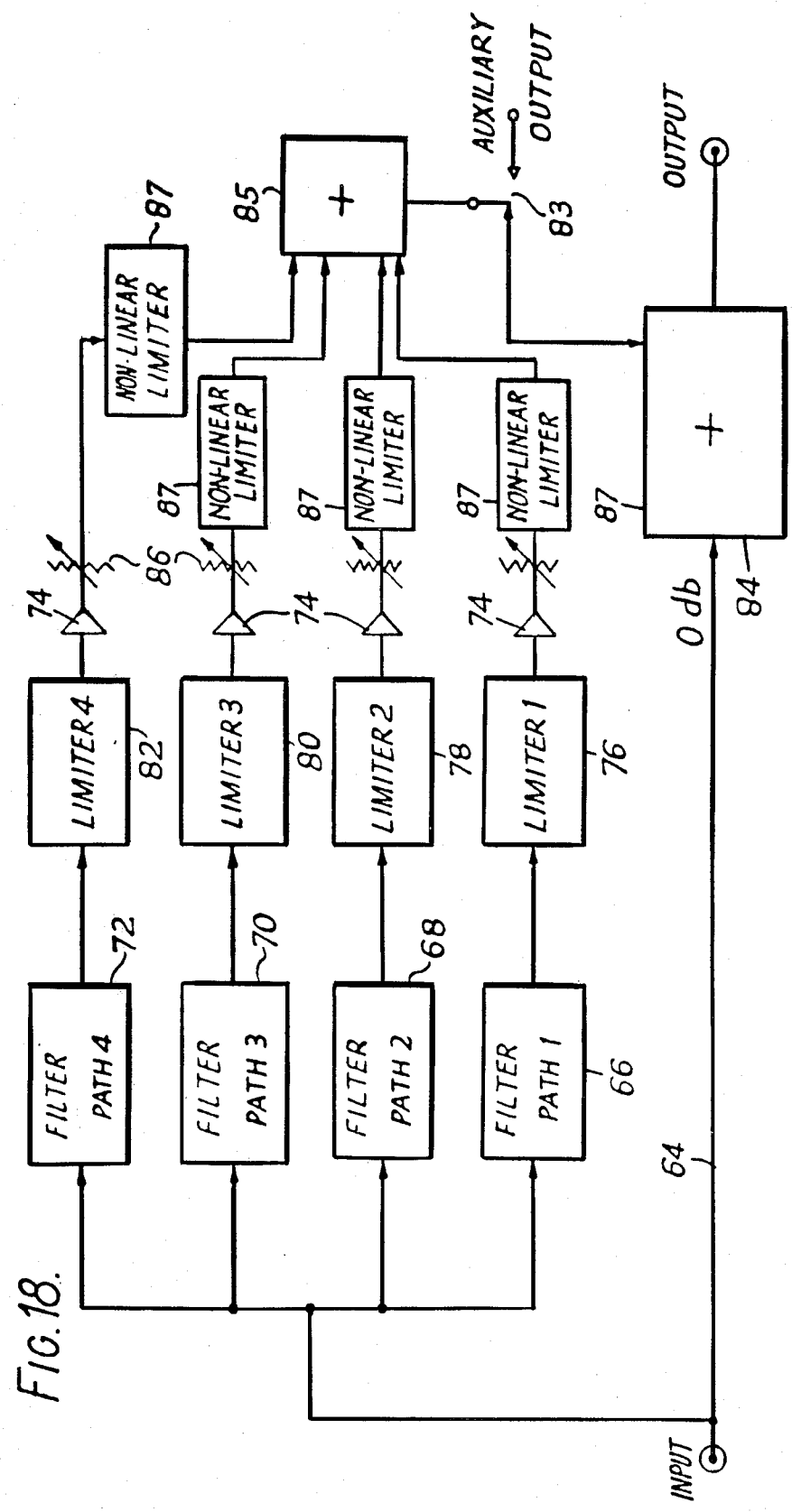

FIG. 18 is a block diagram of a Type I audio compressor.

Figure 18A:
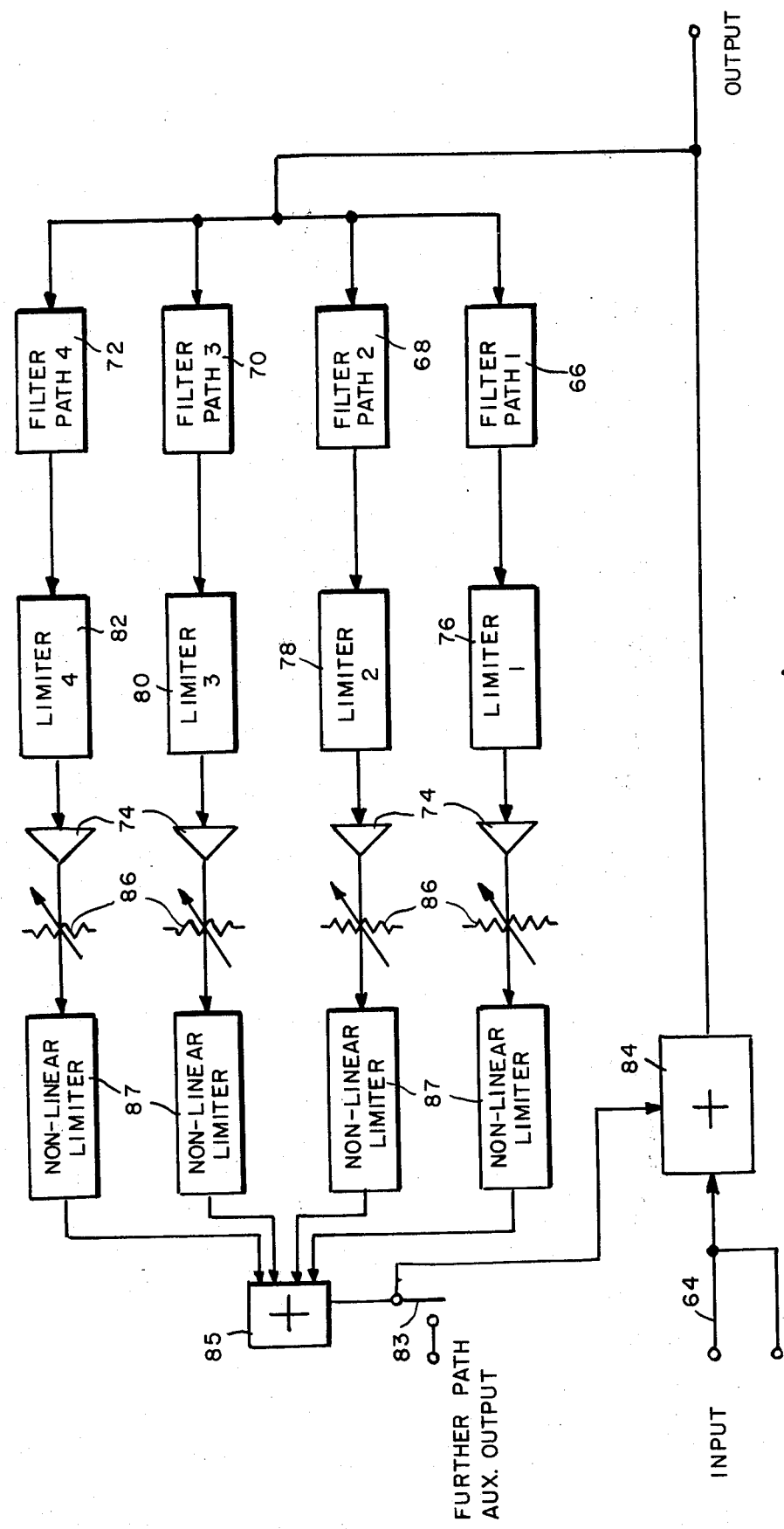

FIG. 18A shows the equivalent Type II compressor.

FIGS. 19(a), (b) and (c) illustrate more characteristic curves.

Figure 20:
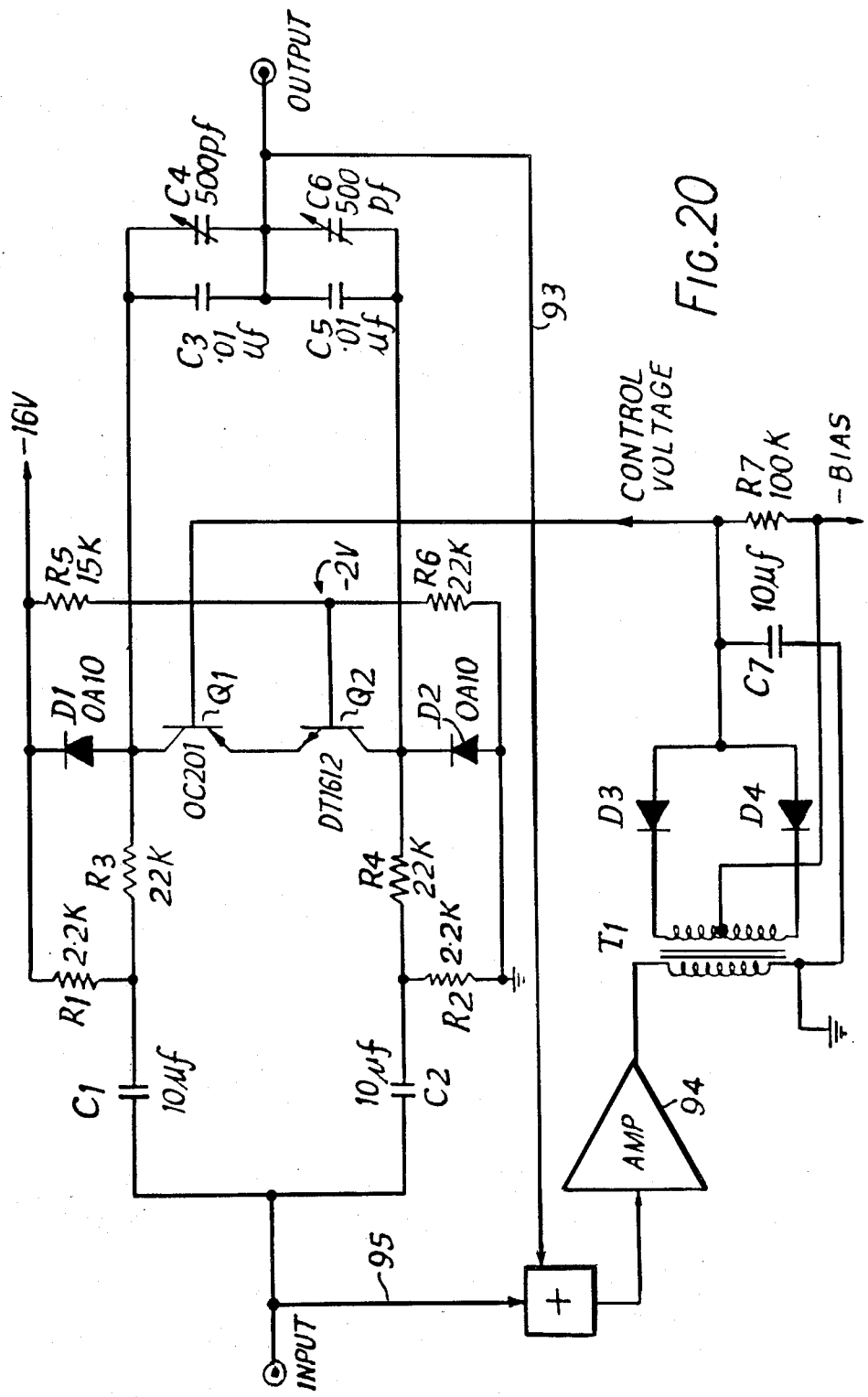

FIG. 20 shows an audio linear limiter.

Figure 21:
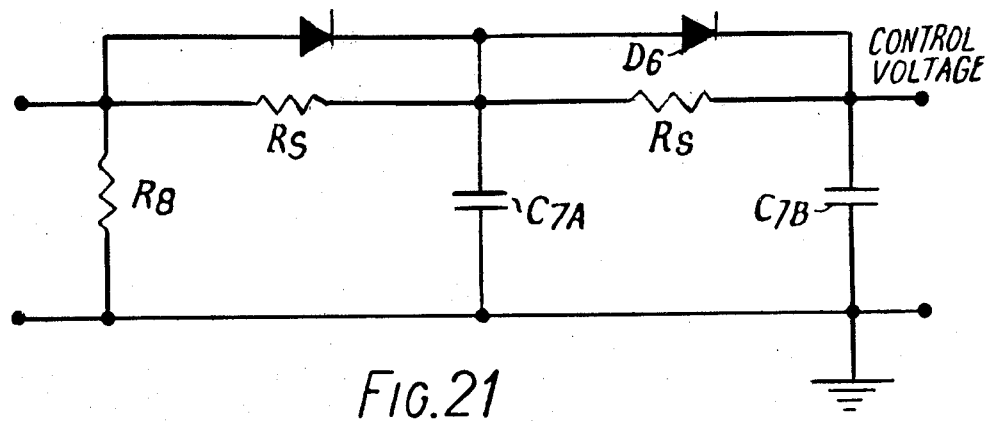
Figure 22:
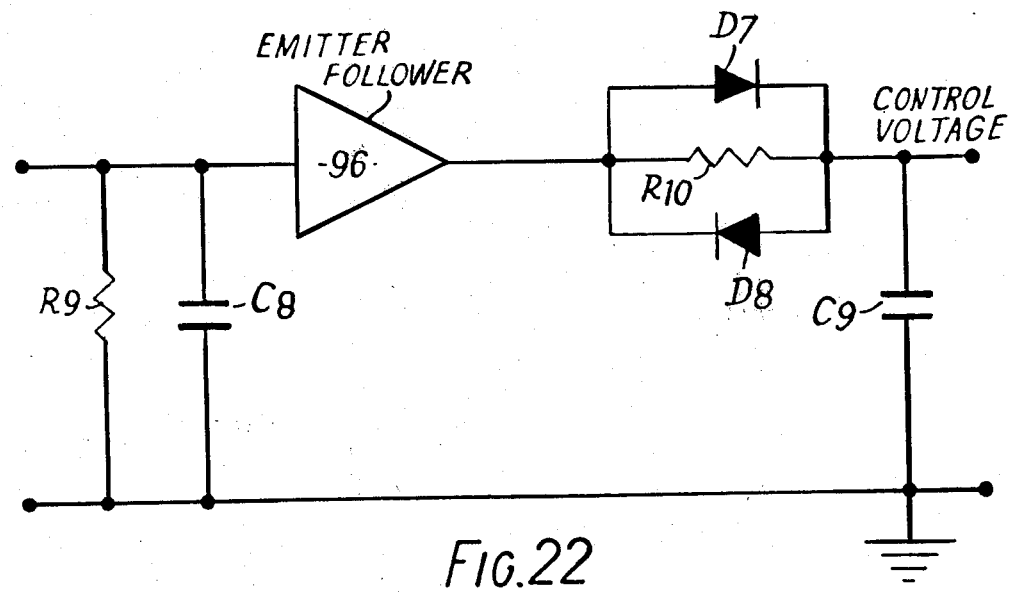

FIGS. 21 and 22 show two improved control signal smoothing circuits for the linear limiter.

Figure 23:
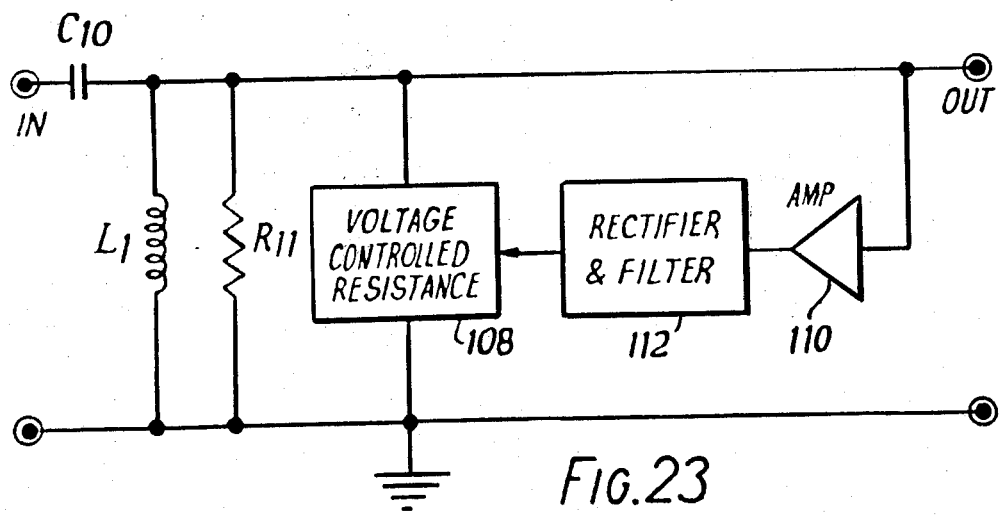

FIG. 23 is a diagram of a modified filter and limiter for one path of the audio compressor.

Figure 24:
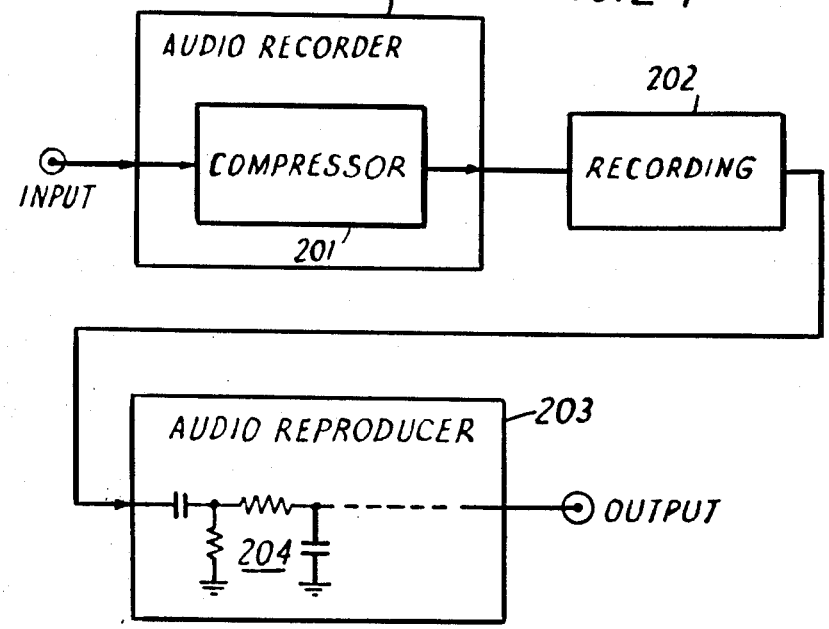

FIG. 24 illustrates a simple noise reduction system with a passive network replacing the expander.

Figure 25A:
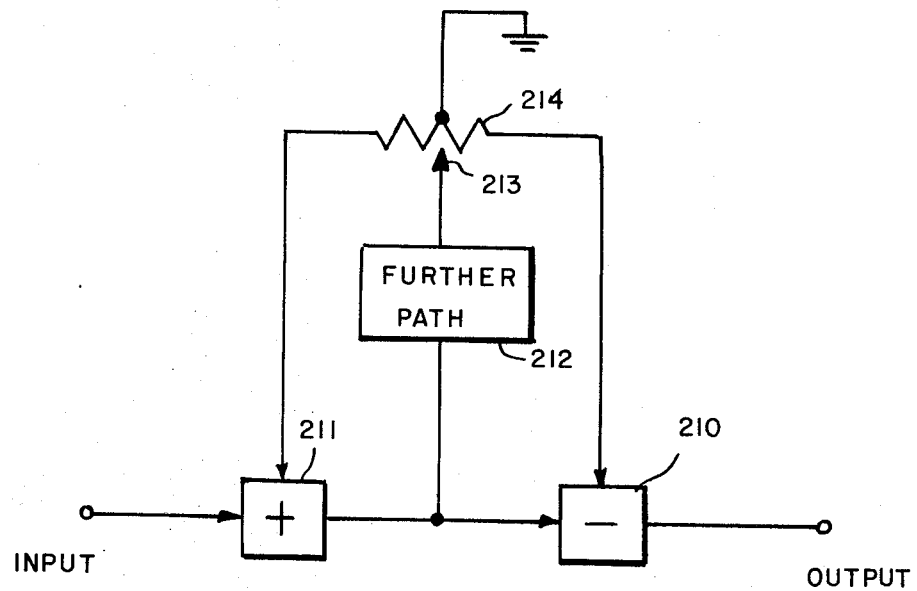
Figure 25:
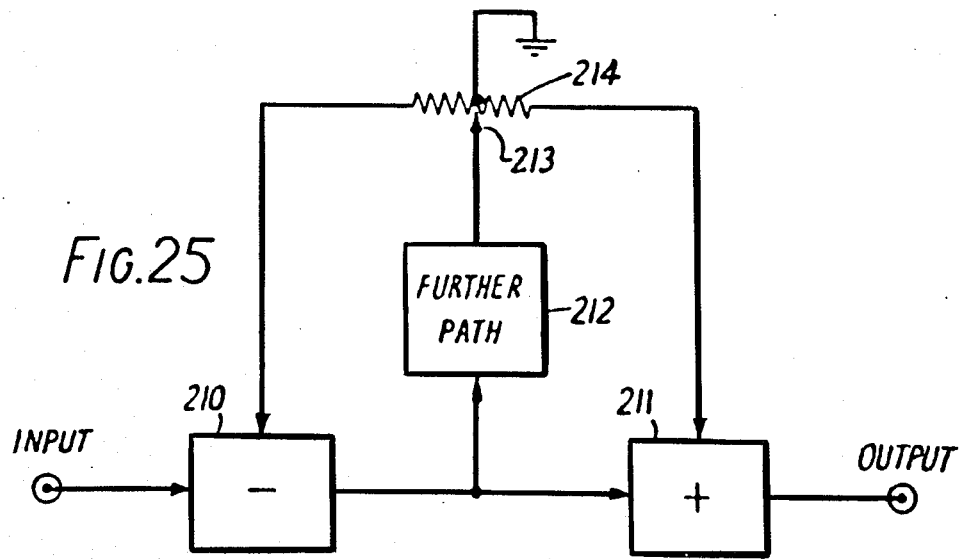

FIG. 25 illustrates a Type I circuit for giving a variable degree of compression or expansion.

FIG. 25A shows the equivalent Type II circuit.

TYPE I DEVICES

Type I devices will first be described with reference to FIG. 1, which shows a complete noise reduction system.

Figure 4:
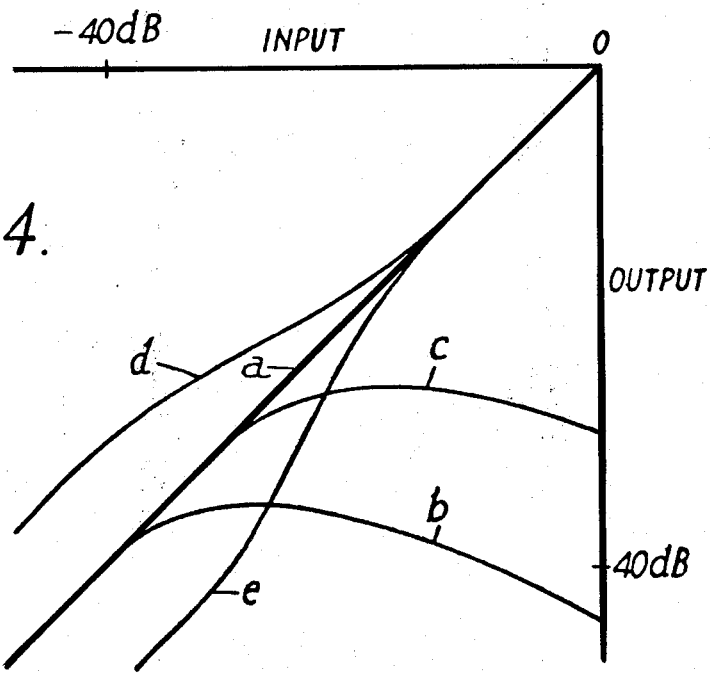
Figure 1A:
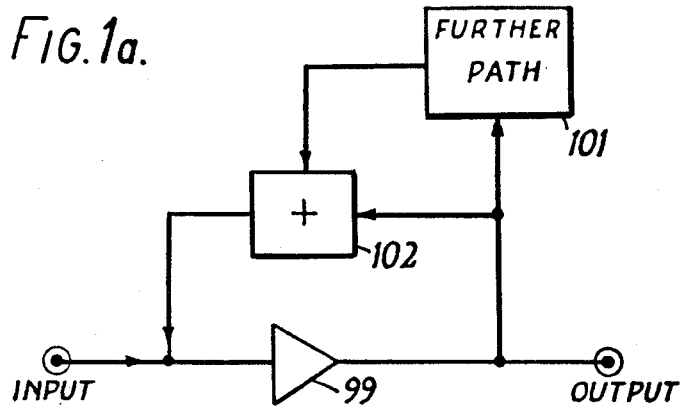
FIG. 1(a) shows a Type I compressor arranged in the feedback loop of an amplifier to make an expander.

In the compressor, a further path 101 derives a special signal component from the input signal, the further path signal component being added by an adder 102 to the straight-through signal of the main path. The output signal thus has increased amplitude at low levels; i.e. it is compressed. The transfer characteristic of a Type I compressor is shown in FIG. 4 curve (d), plotted on a logarithmic or decibel scale. The rising and down-turning signal from the limiter circuit, FIG. 4 curve (b), is added to the straight-through component, FIG. 4 curve (a), to form the required compressed signal (d) which is fed to the recording or transmission channel 100. If desired, the signal from the further path may be fed into a separate recording or transmission channel for subsequent combination with the straight-through component at the receiving and, i.e. the adder 102 may be remote from the compressor and located physically with the expander.

In the expander an identical further path 103 derives a signal component from the system output signal. This signal is subtracted from the recorded or transmitted signal from channel 100 in subtracting means symbolically represented by an inverter 104 and adder 105. The transfer characteristic of the expander is shown in FIG. 4 curve (e) — i.e. substantially unity gain at high-levels, with decreased gain at low-levels to produce noise reduction.

Since the further path signal component has first been added to the main path and then subtracted, it follows that the system output signal is identical with the input. While the system thus produces no overall effect on signal dynamics or frequency response, regardless of the particular characteristics of the two (identical) further paths, it is necessary to choose suitable characteristics in order to achieve a good noise reduction effect.

Type II Devices

The basic layout of Type II devices is given in FIG. 2, which again shows a complete noise reduction system. The same reference numerals are used as in FIG. 1 and the similarity to the Type I configuration is apparent. However, in a Type II expander the further path is not part of a closed loop; the input to the path is taken directly from the recording or transmission channel, and the path output is simply subtracted from the straight-through signal. This simple layout allows correspondingly inexpensive circuitry to be used in practical devices.

The compressor has a complementary form; the further path input is taken from the compressor output, the network output being fed to the adding means. The further path is thus enclosed within a positive feedback loop. However, as the open loop gain is less than unity, there is no tendency towards oscillation. Moreover, it is unnecessary to tailor the amplitude-phase response of the loop outside the pass-band, as is the case with Type I expanders.

To achieve the same compressor or expander transfer characteristics in the Type II system as in the Type I system it is necesssary to use a slightly differently shaped further path transfer characteristic. The difference can be seen in FIG. 4 curves ($c$) and ($b$), in which curve ($c$) relates to the Type II system. A higher threshold and somewhat flatter characteristic are used. These curves apply only to the steady-state properties, and similar adjustments must be made in the dynamic characteristics, longer time-constants being used in the control signal smoothing circuitry of the Type II system.

TYPE I-II Devices

Figure 3:
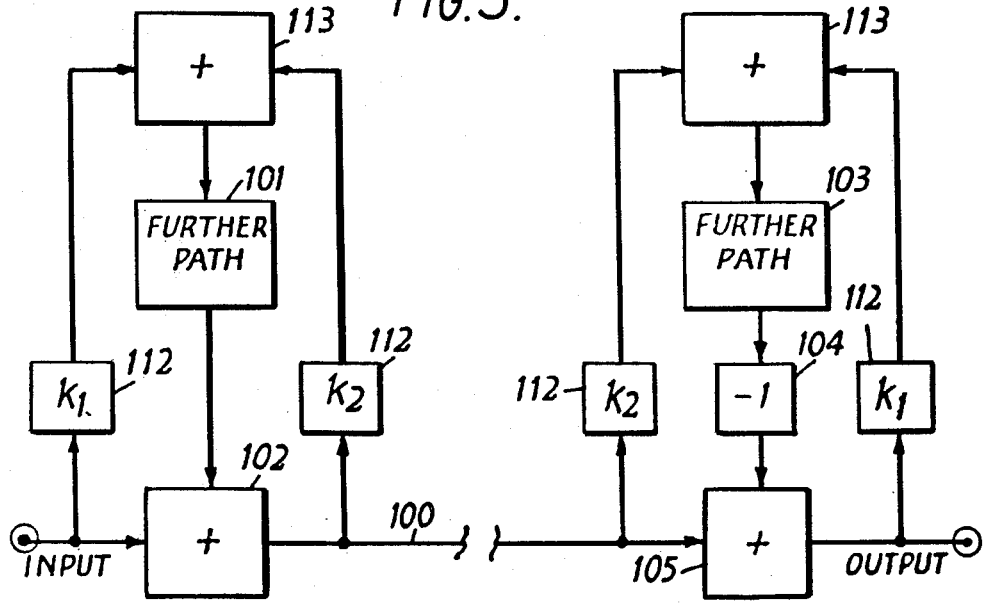
FIG. 3 shows the basic layout of a Type I-II moise reduction system.

The Type I and II devices and noise reduction systems which have been described may be generalized in the form shown in FIG. 3. In this form the input to the further path may be any arbitrary proportion of the input and output signals of the device. These proportions are adjusted by the attenuation constants $k_1$ and $k_2$, introduced by attenuators 112 as shown in the Figure; the symmetrical disposition of the two constants and of the polarity determining elements in the compressor and expander may be noted. Adders 113 combine the $k_1$ and $k_2$ signals to provide the inputs to the further paths 101 and 103. In a Type I system, $k_2 = 0$; in a Type II system, $k_1 = 0$. In the special case $k_1 = k_2$, the only difference between a complementary compressor and expander is the polarity of the further path signal component.

As in the Type I system, the further path signal component in the Type II or Type I-II systems may be fed to a separate recording or transmission channel for subsequent combination with the straight-through component at the receiving end. The two components are separately obtained by tapping off from the two inputs of the combining means 102 in the compressor.

In all types of devices the compressors and expanders are preferably constructed in the manners hereinbefore disclosed, but a compressor or expander may also be formed by including a complete expander or compressor, respectively, of the nature described above in the feedback loop of a high gain feedback amplifier. This method however can only approach, but never achieve, perfect complementarity between the compressor and expander in a complete noise reduction system.

Figure 1:
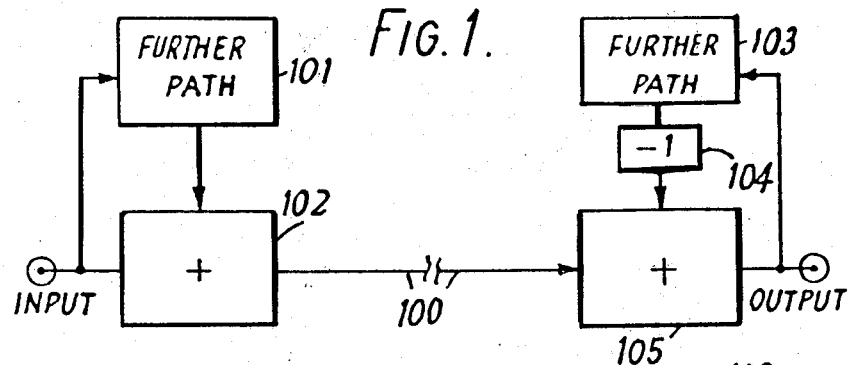
FIG. 1 shows the basic layout of a Type I noise reduction system.

As one example only of the use of this method FIG. 1($a$) shows an expander comprising the Type I compressor of FIG. 1 included in the feedback loop of a high gain amplifier 99.

Shaping of Characteristics

The single limiter compression and expansion curve shaping methods discussed so far may be extended to include the operation of several limiters in parallel (in identical or overlapping fequency bands), each with a different threshold and/or a different applied signal level. In this way, transfer characteristics having various desired shapes can be built up while retaining most of the advantages of the basic single limiter configuration — i.e. high accuracy, low distortion, low noise level, and low overshoot.

By way of illustration of the principle, FIG. 5($a$) shows characteristic curves relating to a Type I compressor with three limiters 150, 151 and 152 (FIG. 6). The characteristic of the main path 153 is shown at ($a$) and the characteristics of the three limiters are shown at ($b$), ($d$), and ($e$), displaced from each other by virtue of the different thresholds. Instead therefore of obtaining the overall characteristic ($c$), as when there is only one limiter with characteristic ($b$), the overall characteristic ($f$) is obtained by the combining means 154. Each limiter 150, 151, 152 can be a non-linear limiter, a linear limiter or a linear limiter followed by a non-linear limiter as is appropriate. The outputs of the limiters are combined by an adder 156 before being added to the signal in the main path by the adder 154. The output of the adder 157 can be clipped by a non-linear limiter 157 to suppress transients in the combined signal.

The shape of the overall characteristic can be controlled closely by selecting the shapes, positions and number of limiter characteristics and, if required, also by combining the output of one or more limiters subtractively instead of additively, as illustrated in FIG. 7 in which the limiter 151 is followed by an inverter 157. An example of this expedient is later described specifically in relation to television signals.

FIGS. 6 and 7 both show the Type I compressor configuration. A straightforward transformation of these configurations in accordance with the teachings of FIG. 2 yields the Type II compressors shown in FIGS. 6A and 7A.

Video Noise Reduction System - Monochrome

In a video noise reduction system, account is taken of the dependably linear phase-frequency response of video recording or transmission systems. Because of this favorable situation, it is possible to design comparatively simple non-linear limiters using diodes.

Referring to FIG. 8, a Type I video compressor is shown in which the signal in a straight-through path 18 is added in circuuit 20 to the outputs of two further paths 9 and 11 provided for reducing noise (in conjunction with an expander) in the 100 KHz – 1 MHz and 1 MHz – 4 MHz bands respectively, these ranges being of the order required for a normal television video signal. The outputs of paths 9 and 11 are added in an adder 19 before being fed to the adder 20. For a 10 dB noise reduction, amplifiers 13 and 14 amplify the low level input signals by 6.7 dB (2.16 times). Each path includes a combined filter (selecting the corresponding band) and limiter, 10 and 12, which prevents the outputs of the two further paths exceeding, say, 1% of the maximum input signal level. At low signal levels the high frequency components at the compressor output will be 10 dB (3.16 times) up on the input level, but at full input level the value of the added components will be only 2.16% of the peak-to-peak signal, negligible overshoot thus being introduced.

The Type I expander shown in FIG. 9 restores the signal, since the two signal paths 9 and 11 are connected between the output and input of subtracting means 21. The paths 9 and 11 are identical in FIGS. 8 and 9. This expander circuit attenuates high frequency components at low signal levels in the high frequency bands and hence attenuates the high frequency noise which causes gaininess. While the attenuation is not present when the high frequency signal level is high, the noise is not then noticeable as it is masked by the picture detail represented by the high frequency signal components. The same masking effect is resonsible for the success of the audio systems, later described, in reducing perceptible noise. Two further paths 9 and 11 are shown by way of example in the expander and compressor of FIGS. 8 and 9. If only a single path were used for the whole band of 100 KHz to 4 MHz, high amplitude signals up to 1 MHz would frequently prevent the reduction of noise above 1 MHz.

In practice it is not necessary to have a separate amplifier in each path 9 and 11. A single amplifier common to both paths may precede the two filter and limiter circuits 10 and 12.

Figure 2:
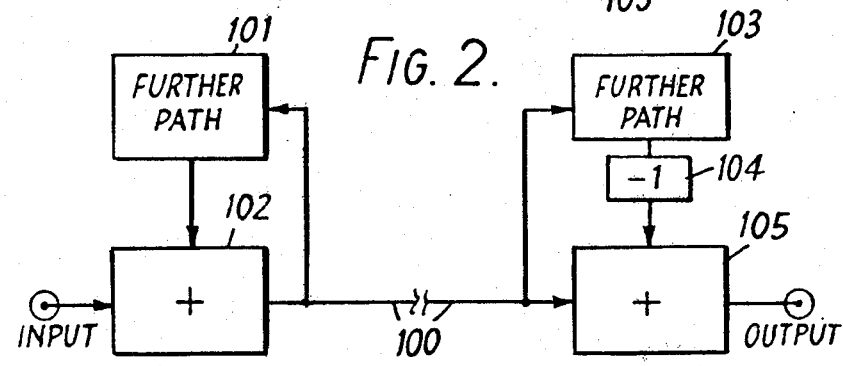
FIG. 2 shows the basic layout of a Type II noise reduction system.

FIGS. 8A and 9A show FIGS. 8 and 9 transformed into the Type II configuration of a compressor and expander respectively, as taught by FIG. 2.

FIG. 10 shows one circuit for the filter and limiter 12 and designed to be fed from a low impedance source. A simple RC network, 24 and 26, gives high-pass characteristics, (i.e. above 1 MHz) and diodes 28 limit the output to small excursions above and below ground. The circuit 10, FIG. 11, has an added RC circuit, 30 and 32, to define the 1 MHz upper cut-off, and the components 24 and 26 have values appropriate to a lower cut-off frequency of 100 KHz.

The diodes 28 are preferably high conductance germanium diodes to minimise the voltage drop thereacross, e.g. to about 0.1 or 0.2 volts. Even so, the input signal voltage must be at a high level if limiting is to be operative at say 1% of the maximum input. An input voltage of 40 volts peak-to-peak, with a bias of a fraction of a volt, is satisfactory. The modification shown in FIG. 12 reduces the drive requirement, as would be convenient in transistor, circuits. The diodes 28 are connected to the filter output point 34 through a capacitor 35 and are returned to the output of a feedback amplifier chain comprising amplifier 36, gain-setting attenuator 38 and emitter follower 40. The voltage swing required at the input is reduced by the factor of the gain of the feedback loop, the effect of which is to shift the limiting threshold in the opposite direction to changes in the input signal level.

It is important to notice the direct connection of the limiting diodes to the filter(s) at point 34, no buffer amplifier being interposed. The filter capacitor charging current is supplied mainly by the diodes for high amplitude transients. The recovery time of the circuit is therefore less than if a buffer were used, in which case the capacitor charging current would be supplied only by resistor 26. The filter components resume their normal, linear functions as soon as the transient has passed and the capacitor has been appropriately charged. The driver stage should be able to deliver sufficient current to charge the capacitor fully within about 0.1 microseconds after the passage of a full, peak-to-peak input step.

The high voltage drive requirement can be eliminated in carrier signal systems by the use of a form of filter and limiter which is complementary to the voltage driven type of FIG. 10 and is shown in FIG. 13 and described later.

An expander may be used to improve noisy video signals which have not previously been subjected to the action of a compressor. Although this practice leads to loss of low-level detail, the loss is surprisingly unnoticeable in normal viewing. When transmitting from a video recording, for example, the operator may increase the gain of each path 9 and 11 sufficiently to reduce noise to an acceptable level. A favourable related aspect is that, when both compressor and expander are used, a certain tolerance is allowable in the matching of the characteristics of their respective further paths.

Type I video compressors and expanders have been treated in detail above. Type II video devices follow a similar pattern, comprising one or more limiters of the type shown in any of FIGS. 10 to 13 together with a combining circuit, according to the general scheme shown in FIG. 2.

Video Down-Turning Characteristics

In video systems, down-turning limiter characteristics are useful mainly for reducing or eliminating overshoots in the compressor output. If a composite video signal is sent through a compressor using limiters with down-turning characteristics, the output synchronising pulses, for example, will have the same overshoot-free appearance as those at the input; a compressed video signal is thus compatible with a normal signal, which simplifies processing and transmission. A further aspect is that the appearance of the compressed image itself is almost compatible with that of a normal image. When overshoots are cnfined only to low-level signals, an image with a very sharp, crisp appearance is obtained, but there are no other evident deviations from normality.

Two down-turning characteristic methods are now described with reference to video signals.

Subtraction Method

The multiple-limiter characteristic curve shaping method has been described previously in the general case. In the video application it is helpful to refer to the limiter circuit, FIG. 10, and to the transfer characteristic curves of FIGS. 5(b) and 5(c), which are plotted on a linear scale for convenience in clarifying subtraction aspects.

If two limiters of the type shown in FIG. 10 are operated in parallel under identical conditions and their output signals are combined subtractively, cancellation will take place. However, if the operating conditions of one limiter are suitably altered (limiting threshold, type of diode, signal gain), it is possible to obtain a useful combined output while achieving the desired down-turning transfer characteristic.

FIG. 5(b) illustrates the use of two different limiting thresholds in this connection. For high amplitude input signals the two limiter circuits yield outputs which level off as shown. Output (a) is multiplied by a suitable factor (k), and output (b) is then subtracted; at high input levels, the result is zero, while at lower levels a normal output is obtained.

FIG 5(c) illustrates the complementary approach, in which both limiters have the same thresholds, but one limiter is driven at a reduced gain. This method is suggested in FIG. 7, in which different preset attenuators 158 are inserted before the three limiters 150, 151 and 152. For high amplitude inputs the two limiter outputs will level off as shown — i.e. the two outputs will be substantially identical. However, at low levels the outputs will differ to the extent of the difference in the applied signal levels. When the two outputs are combined subtractively the required rising and down-turning characteristic is obtained.

Keyed Clamping Method

Keyed clamping methods, which are often used in video line-clamping devices, may be aplied to the problem of obtaining a down-turning video limiting characteristic.

Referring to FIG. 10, a switch can be visualised in parallel with the resistor. For low-level signals the switch is open. For higher amplitude inputs the diodes come into operation. For high amplitude transients the switch closes and remains closed for a short period (of the order of 0.1 μsec) after the end of the transient. The switch then opens and the circuit resumes it normal noise reduction function.

Keyed clamping, being the practical electronic technique by which the above idealized action is obtained, may also be recognized as a form of threshold control, whereby part of the incoming signal is fed forward to the control circuitry of the limiter in such a way as to effect a reduction of the limiting threshold. A down-turning characteristic is thereby produced, as in the audio systems described hereinafter.

FIG. 14 shows a suitable form of keyed clamping. A further limiter circuit 130 for producing clamping pulses is connected in parallel with the signal limiter. The output pulses from the clamping pulse limiter are full-wave rectified in circuit 131, and the resultant unidirectional pulses are then amplitude discriminated by circuit 132, whereby only pulses above a certain amplitude are allowed to pass.

Clamping pulses are then formed in circut 133 and fed at low impedance to a pulse transformer 134 with a balanced secondary winding 135. The secondary winding is connected to the diode bias supplies 136 of the signal limiter 12.

For low-level signals the output of the clamping pulse chain is suppressed by the amplitude discriminator, the fixed bias on the diodes resulting in normal limiter operation. Above a certain signal amplitude, the clamping pulse chain is energised, causing the diodes to become forward-biased. The transients which would normally appear at the output of the signal limiter are thereby suppressed.

A related scheme takes advantage of the fact that in each transient situation only one diode or the other needs to conduct. The output from the clamping pulse limiter can thus be used directly, via an inverting amplifier having a low output impedance, for biasing the signal limiter diodes. In this case the transformer shown in FIG. 14 is removed and the two bias supplied are connected directly to the output of the low-impedance amplifier.

The above basic method may be improved by the use of a pulse forming network between the clamping pulse limiter and the clamping diodes. Such a network may include amplitude discrimination, pulse shaping, pulse-length control, and control of the output pulse amplitudes according to some suitable function of the amplitudes of the pulses from the clamping pulse limiter.

Simplified Video Expander

A simplified version of a Type II expander, shown in FIG. 15, is inexpensive enough to enable it to be incorporated into domestic television receivers, for example, for the purpose of reducing wideband noise and ghost images. The device is preferably driven from a low impedance source, but with suitable proportioning of the circuit elements, satisfactory results are obtained using the video output stage of a television receiver as a driver. The output of the device is then connected directly to the control element of the picture tube.

The circuit of FIG. 15 will be recognized as an inverted form of the expander block diagram in FIG. 2 and of the limiter of FIG. 10. This configuration combines the functions of low-level frequency discrimination, limiting, and subtraction of the further path component from the straight-through signal. For a noise reduction of 10dB, $R_1 = 2.16\ R_2$. The value of C is so chosen as to avoid loading the source unduly at the highest frequency handled, while the value of $R_1 + R_2$, acting together with C, may be made such as to give a cut-of frequency of about 500 kHz, which is suitable for yielding a significant reduction of noise in conventional television signals. In color television, subcarrier trap techniques, discussed later, are used in addition to the elements described above.

While the expander described may be used to treat signals which have not previously been compressed, in an ideal situation a compressor of the type shown in FIG. 2, including a limiter of the type shown in FIG. 10, is used during transmission of the signal. It may be noted that compressed video signals, by themselves having a sharp and crisp appearance, can usually be softened to a near-normal appearance without an expander by appropriate adjustment of the operator controls on the television receiver; compatibility is thus not a serious problem following changeover from the transmission of normal television signals to the transmission of compressed signals.

Simplified Type II expanders may also be used to smooth other kinds of fluctuating signals, such as those encountered in nuclear instrumentation applications (i.e. ratemeter signals, X-ray microanalyser video signals, or other statistically derived analogue signals).

Figure 15B:
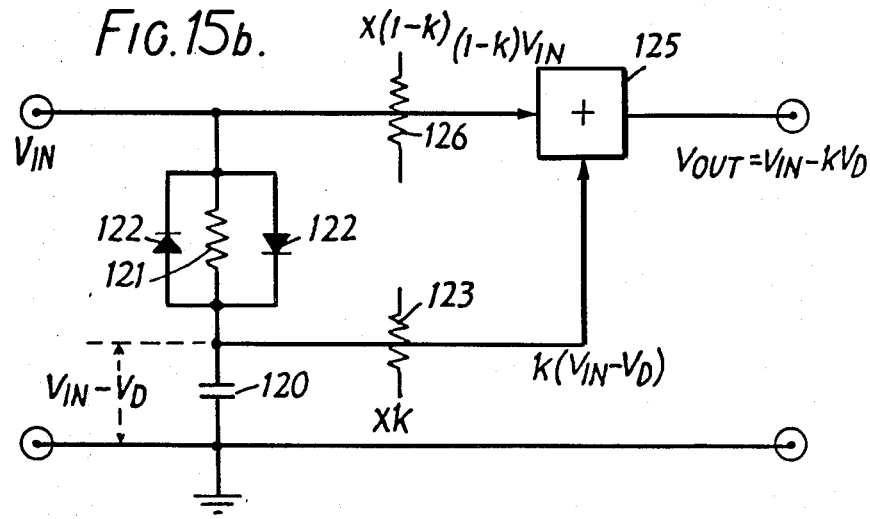
Figure 15C:
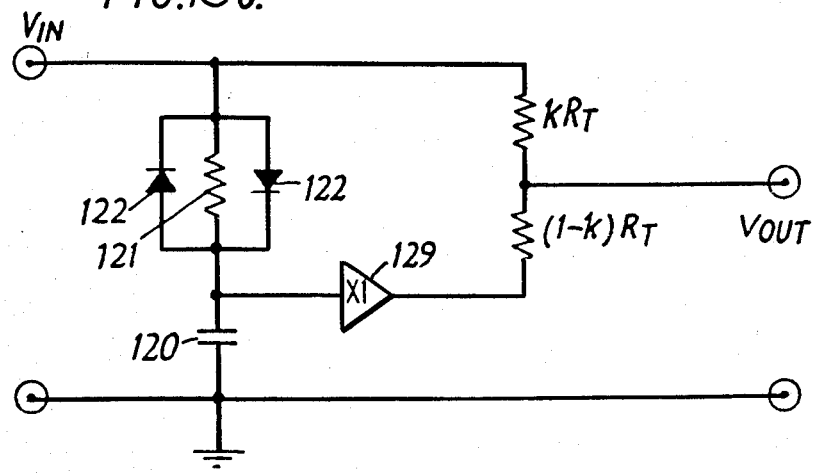

FIGS. 15(a), 15(b) and 15(c) ilustrate the derivation of FIG. 15 from the Type II expander layout shown in FIG. 2. In FIG. 15(a) a basic Type II expander is shown with a filter comprising capacitor 120 and resistor 121, the latter shunted by limiter diodes 122. The input is $V_{IN}$, the limited signal is $V_D$ and an attenuator 123 produces $k\ V_D$ where $k$ is 0.684 for 10 dB noise reduction. The attenuator output $k\ V_D$ is inverted by unity gain amplifier 124 and $-k\ V_D$ is added by adder 125 to the straight through signal $V_{IN}$ so that $V_{OUT} = V_{IN} - k\ V_D$ which, for $k = 0.684$ gives $0.316\ V_{IN}$ for low level, high frequency signals i.e., 10 dB reduction in noise level.

In FIG. 15(b) the filter components have been inverted and an attenuator 126 multiplying by $(1-k)$ has been introduced in the straight-through path to enable the inverter 124 to be eliminated. The adder 125 will in practice be a resistive device and in FIG. 15(c) the adder is shown composed of correctly proportioned resistors 127 and 128, (combined value $R_T$) which enable the attenuators 123 and 126 to be eliminated. However, resistive adders load their sources and, though $V_{IN}$ is assumed to be low impedance, the limiter signal has to be buffered, say by an emitter follower 129.

The final transformation (FIG. 15), eliminating the emitter follower, puts the resistors 127 and 128 in place of the filter resistor 121, wherefore the combined value of these resistors must now equal the filter resistor value R, i.e. $R_T = R$.

Video Noise Reduction System — Color

The invention may be applied to color video signals and is of advantage not only for the reduction of wideband noise, but for reducing moire patterns which arise from interaction between the color sub-carrier and the f.m. carrier system of video recorders.

The compression and expansion may be applied to the R, B and G signals individually, or better to the Y, I and Q signals or to the composite color signal when, as will frequently be the case, component signals are not available separately. In all cases it is necessary to exclude the color sub-carrier from each further path (to the extent of at least 50 dB attenuation), otherwise the sub-carrier will choke the compressor and expander and make noise reduction impossible. When composite signals are being processed, therefore, a low pass filter (cut-off at approximately 2 MHz) is required in each channel. Typically then, noise reduction can be obtained from, say, 100 KHz to 2 MHz in the R, B, and G channels or from 100 KHz to 2 MHz in the Y channel and from 100 KHz to the upper limits of the I and Q channels. A similar approach in the case of the composite signal will give noise reduction from 100 KHz to 2 MHz in the Y channel only, but even this is of advantage since the spurious intermodulation products which give rise to moire patterns are contributed mainly by the Y channel.

If the cut-off frequency is raised to permit the passage of sub-carrier sidebands, say to within 400 KHz of the sub-carrier frequency, the noise reduction coverage will be increased but at the expense of introducing "dead time" (calculated to be of the order of 3 microseconds) whenever there is an abrupt change in the sub-carrier amplitude or phase. "Dead time" refers to time in which the output of the further path remains at the limiting level although the signal level has fallen below this level. Based on the 525 line N.T.S.C. standard, noise reduction would be obtained in the Y channel from 100 KHz to 3.58 MHz minus 400 KHz = 3.14 MHz, in the I channel from 400 KHz to 1.5 MHz and in the Q channel from 400 KHz to 500 KHz. The dead time prevents noise reduction following large, abrupt color transitions, but the burst of noise is likely to be masked subjectively by the color transition, as well as by the brightness change probably accompanying it.

The sideband choking effect may be compared with the previously described behaviour of the monochrome system in which a buffer amplifier is used between the filter circuit and the limiter. In neither case do the diodes enter into the filter network's readjustment to the new conditions imposed by the incidence of a transient. It was seen that when the diodes are allowed to interact with the filter, the filter becomes non-linear with high amplitude transients and is forced to accommodate itself quickly to new conditions. This situation suggests that some analogous arrangement should be possible for response to a carrier and its sidebands.

An idealized behaviour is obtained by a subcarrier trap having a high Q (narrow bandwidth) when the color sidebands and high frequency Y components have low levels, full noise reduction action being possible under these conditions. When the color sidebands and/or high frequency Y components exceed a predetermined level, the Q of the trap is lowered momentarily, thereby dissipating the energy introduced by the sidebands and preventing its storage in reactive elements. As soon as the sideband energy is extinguished, the Q of the circuit is raised and the noise reduction action is resumed.

One suitable circuit is shown in FIG. 16. In addition to a capacitor 60 and resistor 62 defining the lower frequency of the noise reduction band, as in FIG. 10, a parallel tuned sub-carrier trap consisting of inductor 54 and capacitor 56, is included in the series signal path. Optionally series trap, consisting of inductor 54A and capacitor 56A, shunts the signal path. Low-level sideband components are transmitted to the output with undiminished level, the trap(s) being unable to follow such changes while in linear operation. The parallel resonant circuit will be forced to accommodate itself to any large and abrupt change in the amplitude or phase of the carrier (appearance of sidebands) by the action of the diodes 28, which additionally prevent large amplitude components from reaching the series trap.

Noise reduction then covers the Y channel from 100 KHz upwards except for a sharp notch at the sub-carrier frequency. The I and Q channels are covered from a frequency depending on the band-width of the trap(s), e.g. several hundred KHz upwards.

Instrumentation Noise Reduction Systems

Similar techniques to those discussed above for monochrome televsion may be used to deal with wide band instrumentation applications, the frequency ranges of the further paths being suitably modified. Where carrier frequency systems are used it is preferable to split the signal into separate bands, each with its own noise reduction system. A poorer alternative, in which several carriers are treated by a single noise reduction system, is to use a circuit such as that of FIG. 16 with a plurality of traps tuned to the different carrier frequencies. Where no wideband component is treated in addition, the capacitor 60 is eliminated. In such a multiple carrier system, noise reduction ceases in all channels whenever significant sideband components appear in any one channel.

Audio Noise Reduction Systems

Turning now to audio signals, the only fundamental difference from video systems lies in the need for linear limiting, owing to the lack of preservation of phase in audio information channels. A noise reduction further path is necessary for a high frequency band and usually for a low frequency band.

With regard to professional audio noise reduction systems, the further paths shown in FIG. 17 give good results. There are four further paths, Path 1 to Path 4 respectively assigned to four frequency bands: 80 Hz low-pass; 80 Hz — 3 KHz band-pass; 3 KHz high pass; and 9 KHz high-pass. The filters 106 are followed by identical linear limiters 107 having transfer characteristics similar to that shown in FIG. 4 (b). Each limiter is controlled by a rectified and smoothed control signal 108 obtained from a combination of the input signal to the limiter, and the path output signal, such a combination producing the desired rising and down-turning characteristic. Non-linear limiters 109 (diode clipper circuits) follow the linear limiters, their function being to limit the amplitudes of transients passed during the limiter attack period (about 1 ms). The outputs of the four bands are then combined in an adder 110, which can be followed by a further non-linear limiter 111.

The further non-linear limiter clips the summed transient signals of the non-linear limiter in the several bands, thereby resulting in minimal overshoot. The network shown provides a further path signal component which is capable of producing a reduction of rumble, hum, print-through, cross-talk and hiss.

The compressor circuit is shown again in FIG. 18, in slightly more detail in Type I configuration and includes a straight-through path 64, adder 84, filters 66, 68, 70 and 72 for the four bands, separate, linear limiters 76, 78, 80 and 82 and further path combining means 85, it being understood that each path includes such amplifiers and attenuators as are necessary, e.g. amplifiers 74 and attenuators 86. FIG. 18A shows the corresponding Type II compressor.

The corresponding expanders are not shown, as their construction will be immediately apparent from FIG. 1 and 2 and by analogy with FIGS. 9 and 9A. Indeed, as a practical matter, a single unit may be built with provision for switching or straping connections to convert the unit to either a compressor or expander as required. The feedback connection required in the Type I expander precludes the use of filters having fast changes in phase shift with frequency.

Each limiter may commence to act at about −40 dB, full limiting being achieved at about −30 dB; the contribution of any of the noise reduction paths at high signal levels is therefore negligible and cannot cause distortion or significant overshoots under transient signal conditions. As an optional feature, the output of each limiter may be caused to decrease as the level increases above −30 dB, as later described, the output falling to a negligible value at say −10 dB. This feature is desirable where high values of noise reduction, e.g. 15 dB are required.

Figure 19:
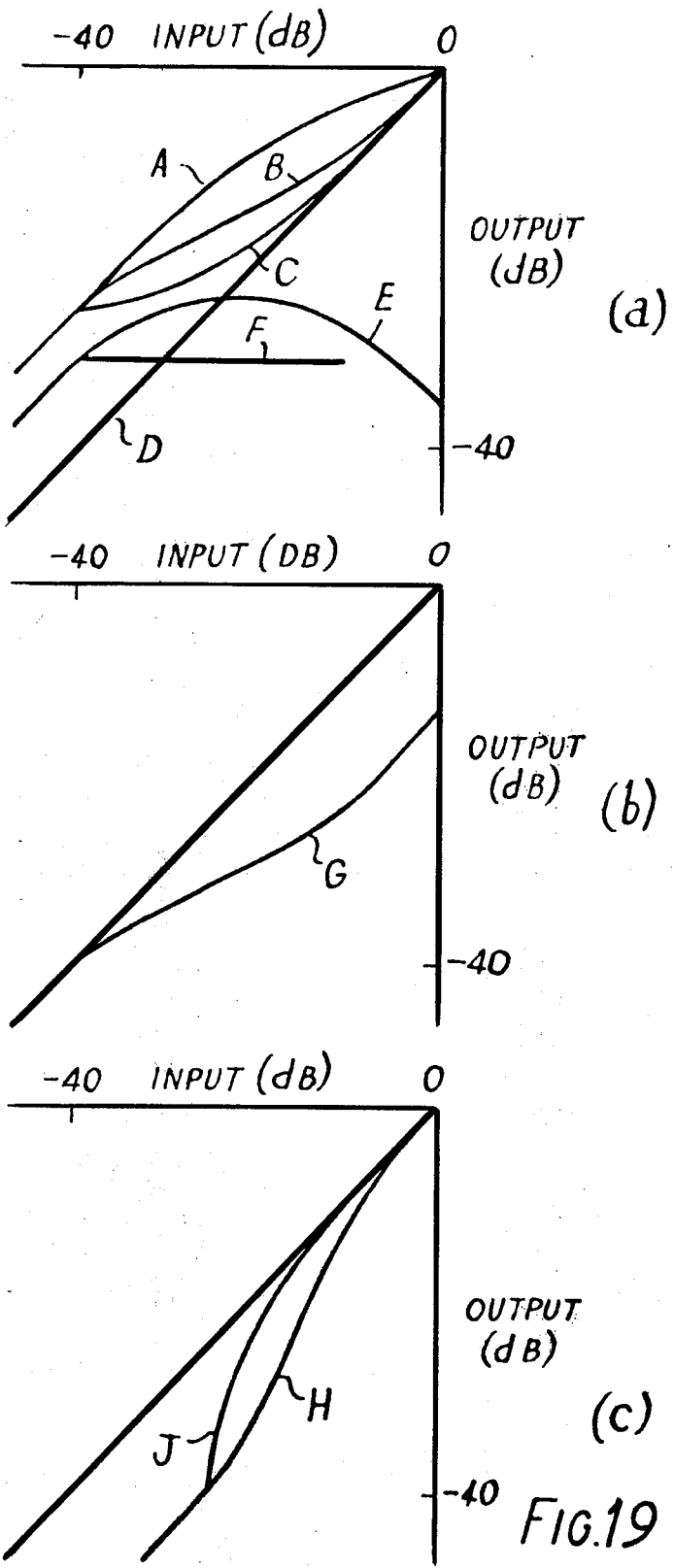

FIG. 19($a$) shows compressor operating laws, curve A being the law of a conventional compressor which operates on the full signal. Curve D represents the unaltered component of the straight-through path of the present invention and curve E represents the low level differential component from a limiter circuit. The characteristics D and E add to give the overall compression characteristic, B.

FIG. 20 shows a suitable limiter circuit, the component values being appropriate to path 1, i.e. limiter 76.

The use of the exponential voltage-current characteristic of semiconductor diodes is a convenient way of providing a variable resistance which can readily be controlled by a d.c. bias current. Because in the present invention the limiters pass only low signal levels, distortion generated by the diodes is negligible.

Referring to FIG. 20, the dynamic resistances of diodes $D_1$ and $D_2$ are controlled by the current passing through silicon transistors $Q_1$ and $Q_2$. Resistive voltage dividers are formed by $R_3$ and $D_1$ and by $R_4$ and $D_2$, the balanced connection cancelling out the signals produced by the control current. When $Q_1$ and $Q_2$ are in the cutoff condition the input signal will be passed to the output at essentially unaltered level, while if a control voltage is applied to $Q_1$, the dynamic resistance of the diodes will be reduced and the output signal will be attenuated.

Capacitors $C_1$, $C_2$, $C_3$, and $C_5$ are for coupling purposes only, having no frequency discrimination or time-constant effects. Resistors $R_1$ and $R_2$ tie the d.c. voltages of the outputs of the input capacitors securely to the supply voltage and ground, respectively. Capacitors $C_3$ and $C_5$ add together the voltages of the two attenuation circuits, while capacitors $C_4$ and $C_6$ are adjusted to cancel out the control signal.

The amplifier 94 drives the full wave rectifier circuit $T_1$, $D_3$, and $D_4$, charging the smoothing capacitor $C_7$. Resistor $R_7$, in combination with $C_7$, produces a time constant of one second, which is suitable for the signals handled by the low frequency channel.

In the circuit as shown the onset of the limiting action will be quite abrupt. By the use of a simple diode-resistor circuit between the emitters of $Q_1$ and $Q_2$ a smoother limiting characteristic can be obtained, which is of advantage for good tracking between the record and playback circuits and for obtaining consistent characteristics from unit to unit.

The signal to the amplifier 94 can be provided by a feed-back connection 93 or by a feed-forward connection 95 or by both connections to provide for the above-mentioned cut-off of the output at about −10 dB.

In order to ensure that the compression characteristic in a particular band is determined only by the frequencies in that band, it is possible to introduce appropriate band-pass filters into each of the control amplifiers 94. This approach may be useful where the filters 66 etc. used on the inputs of the limiters do not provide sufficient rejection, sharper filters here being precluded by the feedback configuration used in the expander.

Control Signal Smoothing

The use of separate circuits for the four different frequency bands not only allows noise reduction to take place in one band irrespective of the signal level in another band, but also permits the limiter time constants to be suited to the frequencies handled thereby. For example, path 4 may have a recovery time-constant as small as a few milliseconds, (compared with times of the order of 1 sec. ordinarily associated with compression or limiting). When each time-constant is made suitable to the range of frequencies which it controls, the usual noise modulation effects are absent.

The simple smoothing capacitor $C_7$ of FIG. 20 requires many cycles of the input waveform to discharge and results in slow recovery of the limiter. If the time constant is shortened to overcome this defect, ripple appears in the control voltage and distorts the compressed signal.

In order to overcome this problem, the circuit shown in FIG. 21 may replace the capacitor $C_7$ and resistor $R_7$ in FIG. 20.

A suitable RC decay time constant ($R_8C_7$) is chosen, and the capacitor $C_7$ is split into two parts $C_{7A}$ and $C_{7B}$, these being fed by two series resistors $R_s$. The series resistors are so chosen that with the capacitors the ripple voltage is reduced to the desired value. Unfortunately, the circuit then has an attack time which is far too great. However, when diodes $D_5$ and $D_4$ are connected in parallel with the resistors $R_s$, the fast rise time is restored without affecting the decay time. The diodes $D_5$ and $D_6$ are chosen to have voltage-current characteristics allowing effective filtering of the ripple component while being suitably conducting for larger amplitude excursions.

In the non-linear integrator described above there is a limit to the amount of filtering which can be achieved for a given decay (i.e. recovery) time. Under these limiting conditions the ripple voltage will increase if the recovery time to reduced. For the purpose of allowing a reduction in recovery time a further refinement has been devised (FIG. 22). A pre-integrator consisting of resistor $R_9$ and capacitor $C_8$ is arranged to have the desired decay time-constant $R_9 C_8$; the pre-integrator can also be of the type shown in FIG. 21, yielding a smoother output wave without disadvantage. The output of the pre-integrator feeds an emitter follower 96, which serves as a low impedance driver for a further integrator circuit. Owing to the diodes $D_7$ and $D_8$, the capacitor $C_9$ is charged or discharged quickly, following the input wave, for large excursions. A fast attack or rise time is hence preserved and the decay time is caused to follow that of the pre-integrator. But under equilibrium conditions the diodes are in an essentially non-conducting state, and the integrator $R_{10}C_9$ smoothes the wave to any degree desired.

The main feature of the above described non-linear integration scheme is that low-frequency distortion and the generation of modulation products can be held to low values. Furthermore, the compression action does not tend to be controlled by short transients but by more extended aspects of the signal, a property which is important for yielding a good noise reduction effect.

While the response time of the above circuit is progressively reduced with increasing variations is signal amplitude, overshoots will be produced if the incoming amplitude transitions are large enough. In the present system the amplitudes of such overshoots are reduced by following the linear limiter with conventional, non-linear limiter 87, whose effect is to clip symmetrically the output of the linear limiter 82 when a larger suddenly applied signal passes therethrough. Overshoot is thereby limited to say 1 or 2 dB with a full amplitude signal. The non-linear limiter does not introduce audible distortion, even on the most difficult types of programme material, such as piano, because the limiter output is small compared with the signal in the main path and because the distortion is of such short duration.

Variable Cut-Off System

In a modified embodiment of the audio compressor or expander the limiting action in paths 1 and 4 is achieved by moving the top and bottom cut-off frequencies of the respective bands respectively down and up whenever the path output exceeds a certain level. One or more mid-frequency bands using limiters may also be used, or omitted, depending on the application. Further description will be confined to path 4, the converse treatment in path 1 being apparent therefrom. Thus, at low levels at high frequencies, path 4 may boost signals from 2 KHz upwards. If a high amplitude signal occurs above this frequency, the cut-off frequency of the filter shifts upwards. FIG. 23 shows a suitable filter and limiter circuit for achieving this.

The elements $C_{10}$, $L_1$ and $R_{11}$ form a conventional high pass filter. A voltage controlled resistance 148, which may be similar to the balanced diode circuit $D_1$, $D_2$ etc., shown in FIG. 20, is in parallel with $R_{11}$ and is biased so as normally to present a high impedance. However, the output signal is amplified at 140 and rectified and filtered by circuit 142 to provide a control signal for the resistance 148 such that the resistance falls as the signal amplitude increases. This action shifts the filter cut-off frequency upwards. Preferably, the slope is 12 dB octave when resistance 108 is high impedance, to prevent incorrect operation being caused by high amplitude components below 2 KHz; but the slope may fall to 6 dB/octave as the cut-off frequency rises without detriment.

The variable cut-off filter may take various other forms, using Hall effect devices, reactance tubes, voltage controlled capacitances, transistors, FET's or light controlled resistors for example. The time constants of the rectifier-filter circuit 142 may be of the order of 100 milliseconds for the high frequency channel and a few tenths of a second for the low frequency channel.

Methods of providing a complete cut-off effect are possible as in the case of the limiter of FIG. 20. One method would be to monitor the a.c. current passing through the voltage controlled resistance 148. When the current exceeds a certain value a voltage derived from this current would be fed into the control circuit, which would thereby lower the resistance still further. The output signal would then be cut off, and would remain so until the input voltage or frequency distribution has changed in such a way as to reduce the sampled current.

Other refinements include the introduction of a simple frequency discriminating network either in the control amplifier 140 or in the output of the circuit of FIG. 23 for the purpose of lowering the threshold voltage for very high or very low frequencies, which is sometimes necessary in order to prevent overloading of some types of highly equalized recording systems.

The audio compressors and expanders described above may be used in many fields, including tape recording, disc recording, motion picture sound recording, radio relay systems, sound broadcasting, and telephone networks. For example, master tapes can be produced with a high S/N ratio, even after repeated dubbing, and commercial discs or pre-recorded tapes can be recorded through a compressor for playback through an expander.

Noise reduction systems based on the compressors of FIGS. 17 and 23 with their corresponding expanders, have been tested under the most stringent conditions and do not introduce any detectable degradation of programme material of the most difficult kinds.

Carrier Frequency Noise Reduction Systems

Instances have previously been described in which it is not possible to operate upon a signal directly but only upon a carrier signal on which the signal is modulated. Color television and instrumentation applications have been discussed, but the principle is applicable in carrier signal situations in general.

In some applications, such as those involving audio signals, linear limiters should be used, but in other cases non-linear limiting may be acceptable; where limiter time-constants must be held to very low values or eliminated altogether the limiting must be accomplished non-linearly.

Except where suppressed carrier signals are to be treated, it is necessary to employ a carrier rejection filter at the further path input; if several further paths are used, the carrier rejection filter can be situated at the joint input to all further paths.

The further paths used in carrier compressors and expanders are analogous to those which have been described previously; once the carrier has been rejected, the sidebands can be treated in various ways. If a single further path and no filter are used, broadband compression or expansion results. Alternatively several further paths can be employed, each having a filter tuned to a given sideband frequency range, with resulting compression or expansion in the modulation signal frequency ranges corresponding to the filter frequencies used.

To avoid distortion in double-sideband carrier systems it is preferable to use filters which treat the sidebands on a symmetrical basis in each further path. In practice, this can be achieved by the combined use of band-pass and band rejection filters, both being centered on the carrier frequency but with appropriate differences in bandwidths.

In a simple carrier noise reduction system which would be suitable for audio signals, the carrier rejection filter can be chosen to attenuate the sidebands of the low and medium audio frequencies in addition to the carrier. Noise reduction will thus be effective mainly at the higher audio frequencies, to provide useful hiss reduction. If an additional further path with a narrower rejection filter is employed, then the noise reduction action will be extended farther down in audio frequency. The effects of the further paths add at the sideband frequencies corresponding to the higher audio frequencies, but only the first further path will be operative when the second one is blocked by high-level sidebands corresponding to the mid-audio frequencies.

In previous sections, limiter circuits for audio and video signals were described in which the limiting action is accomplished by automatically changing the filter response to narrow the pass band when the filter output rises above a certain level. A similar approach is possible with carrier signal compressors and expanders. For channels in which phase is preserved, the non-linear approach described for use with color subcarriers can be used. For audio signals the filter should operate linearly, and in a practical circuit the general arrangement shown in FIG. 16 can be employed, except that a controllable resistance element, such as an FET, is added in parallel with resistor 62 and operated by a rectified and smoothed control voltage. The circuit operates linearly except during sudden bursts of high amplitude sidebands, which correspond to high amplitude audio transients and cause the diodes to conduct during the limiter attack period. In a practical circuit, the clipper diodes would normally be situated at a later point in the circuit, following amplification of the limited signal. The series trap 54A and 56A is optional.

A current driver version of the limiter of FIG. 10 has already been mentioned, being illustrated in FIG. 13 and being suitable for use with a carrier type signal, i.e. without a DC component. The capacitors 24 (FIG. 10) is replaced by a parallel tuned carrier rejection circuit 23 (FIG. 13), the resistor 26 is retained and the diodes 28 are removed. In their place a symmetrical non-linear device or circuit 25 is put in series with the rejection circuit 23. This device or circuit 25 has a relatively low impedance up to a given applied voltage, above which the current remains substantially constant. Constant current diodes or transistor collector characteristics, for example, can be utilized in this connection. A series tuned carrier trap circuit 23A is parallel with the resistor 26 is optional.

Related Devices

Related devices or systems based on the principles of the present invention may be mentioned.

A full band noise reduction system may be used in some cases. Such a system takes the form of path 4 of FIG. 18 omitting the filter 72, using curves B and H in FIG. 19 in recording and playback respectively. In other cases, full coverage of the audio frequency band may not be needed, and a single path with an appropriate filter to deal with, say, hiss or rumble may be used. A narrow band filter may be used to deal with noise at a specific frequency, such as hum or a whistle; the filter may be made tunable if required. Such a narrow-band path may be used in addition to the paths providing full-band coverage, as in FIGS. 17 and 18. The narrow band path can then function even when the action of the broad band path encompassing the narrow path is blocked by high level signals. Where the noise level is high and of a wideband nature it is useful to employ a large number of narrow band paths.

The use of separate information channels for the direct signal and the signals from the noise reduction path(s) has been briefly mentioned. In effect, referring to FIG. 18, this arrangement is equivalent to removing the adding circuit 84 from the compressor to the expander, which is illustrated schematically by showing a switch 83 for feeding the output of the adder 85 to an auxiliary output for transmission or recording in a channel parallel to that of the straight-through signal. This modification has application in compatible VHF (FM) transmissions, (the noise reduction signal being modulated on a sub-carrier) compatible disc recordings (the two channels being recorded separately by the techniques used in stereo recording), and compatible tape recordings. In such tape recordings the noise reduction channel can be recorded at a higher level on a narrow track outside the region scanned by the normal head, which reproduces only the direct signal. For noise reduction operation, an additional head scans the narrow track or a head of extra width scans both this and the direct signal track.

For non-critical applications, however, the compressed signal is more or less compatible, it being possible to dispense with the expander if a simple passive network is used to correct the bass and treble boost effectively introduced by the compressor. For the parameters used in the present system the network should provide a 6 dB/octave roll-off starting at about 100Hz at the bass end and about 2 or 3 KHz at the treble end.

This is illustrated in FIG. 24 which shows an audio recorder 200, e.g. a tape recorder, incorporating a compressor 201 such as is illustrated in FIG. 17 for example. The recorder produces a recording 202 with compressed characteristics, constituting the information channel between the recorder 200 and a reproducer 203, e.g. a tape reproducer. The reproducer 203 does not include an expander but passive bass and treble roll-off circuits 204 are employed with characteristics tailored to give equalization of the characteristics of the compressor 201. Similar considerations apply to audio transmission and receiving systems and also to non-audio systems.

The invention also facilitates the reduction of distortion, in that a lower recording level may be used without sacrificing signal to noise ratio; recording is then done in accordance with curve G in FIG. 18(b) with playback using a corresponding expander characteristic. It is also advantageous to use the invention to permit a lower recording level and hence a higher density of information, as by a finer groove pitch in disc recording for example.

It will be appreciated that the filter parameters and circuit time constants in the devices according to the invention can be changed as necessary to allow for different speeds of recording and playing back signals, e.g. as in high speed tape duplication. Compressors and expanders can be supplied with plug in modules corresponding to the different speeds.

Compressors and expanders can also be used independently for various signal modification purposes. A compressor with a full-band further path can be used for reducing the dynamic range of an audio signal. If several further paths covering various frequency ranges are employed, it is possible to create special dynamic equalization characteristics.

Full-band expanders are similarly useful for expanding signals and particularly for reducing background noise in the absence of signals or during low-level passages. Expanders using filters in one or more further paths are capable of effecting a useful reduction of background noise in the presence of signals. For example, such an expander can be used for reducing hiss on old 78 rpm records while subjectively interfering with the signal less than would be the case with conventional filtering methods.

In the use of expanders for reduction of discrete frequency noises, bandpass filters are provided in separate further paths for each interfering frequency, each limiter having an appropriate threshold setting. Whistles or power line harmonics in audio signals and interfering RF in video signals, as examples, can be reduced in this way with minimal effects on the signal itself. If a signal appears at one of the noise frequencies the noise reduction action is momentarily blocked, but the interference is then effectively masked by the signal.

In these specialized applications it is sometimes useful to employ sharper limiting characteristics in the further paths than are normally used in complete noise reduction systems. An example of such a characteristic is shown in F of FIG. 19(a) which results from a higher d.c. loop gain and a sharper limiting threshold than in the case of curve E. The corresponding compression and expansion curves are shown at C (FIG. 19(a)) and J (FIG. 19(c)).

Because of the symmetrical configuration of the compressors and expanders according to the present invention, a variable control can be used to pass smoothly from the compression mode to the expansion mode. With compression-expansion controls and filter characteristic controls in each of several further paths, it would be possible to create musical effects with audio signals and special visual effects with video signals.

FIG. 25 shows a Type I expander/compressor with a subtracting network 210 and an adding network 211 in series in the main path. The further path 212 has its input connected to the output of the subtracting network 210 and has its output connected to the slides 213 of a potentiometer 214. The potentiometer 214 has an earthed center tap and its two ends are connected respectively to the subtracting network 210 and the adding network 211. In the central position of the slides 213 the potentiometer applies no input to either of the two networks 210 and 211 and there is no compression or expansion. Sliding the slides to the right progressively provides an input to the adding network 211 to yield compressor action. Similarly, progressive slides movement to the left gives a progressively increasing expander action.

While the above description of a combined compressor/expander relates to Type I devices, the same principles apply also to Type II devices. This is illustrated in FIG. 25A in which the networks 210 and 211 have been interchanged so that the further path 212 receives its input from the output side of the adding network 211 and from the input side of the subtracting network 210, in accordance with the teachings of FIG. 2. In the general case, in which more than one limiter or more than one further path may be used, any given limiter may be connected independently to operate in the Type I or Type II compression or expansion mode. The associated filter may be shared with another limiter, or the filters may be independent in identical, overlapping, or different frequency bands.

The subtraction down-turning methods which have been described previously were presented simply in terms of the subtraction of the outputs of two limiter circuits. However, according to the general compressor/expander concept above, these down-turning methods are examples of combined compression and expansion functions in the same frequency band. That is, in a typical case one limiter may be operating in the Type I compression mode, while the other limiter may be operating in the Type II expansion mode. Many other combinations are possible to create special combined compression and expansion characteristics.

In some audio applications it is useful to be able to boost the high and low frequencies during low-level passages according to the Fletcher-Munson curves, in order to compensate for the low-level frequency response characteristics of the ear. This operation can be accomplished, using a suitable filter, with a compressor having a law of the type shown in FIG. 19(a) curve B, but the exact shape used would have to be chosen, together with the response of the filter, to give the best overall fit to the Fletcher-Munson curves. It would also be possible to obtain the required characteristics by means of separate low and high frequency channels; this approach would be preferable from the point of view of optimising the compressor time constants.

I claim:

1. A dynamic range processing method for processing an input signal to produce an output signal having a dynamic range selectively compressed or expanded relative to the dynamic range of said input signal, said method comprising processing a first signal to produce a second signal by restricting, above a low-level threshold, the amplitude of said second signal, selectively, for compressing said dynamic range, deriving said first signal from said output signal so that said first signal has dynamic range linearity relative to said output signal, and combining said second signal with a third signal derived from and having dynamic range linearity relative to said input signal, said combining being in such sense as to boost said third signal, and to produce said output signal, and selectively, for expanding said dynamic range, deriving said first signal from said input signal so that said first signal has dynamic range linearity relative to said input signal, and combining said second signal with a fourth signal derived from and having dynamic range linearity relative to said input signal, said combining being in such sense as to buck said fourth signal, and to produce said output signal.

2. A dynamic range processing system being adapted to be selectively controlled to operate in a compression or an expansion operating mode and comprising a main signal path responsive to an input signal to produce a first signal component which in a specified frequency band has dynamic range linearity relative to said input signal, said main signal path including a first signal combining means followed by a second signal combining means, a second component producing means, for producing a second signal component, and responsive to the output of said first combining means, said second component producing means including restricting means for restricting, above a low-level threshold, the amplitude of said second component, and a selective signal coupling means for selectively coupling the output of said second component producing means either to said first combining means for boosting said first component by said second component for operation in said compression mode, or to said second combining means for bucking said first component by said second component for operation in said expansion mode.

* * * * *